(12) United States Patent
Hirose et al.

(10) Patent No.: US 8,324,691 B2
(45) Date of Patent: Dec. 4, 2012

(54) POWER SEMICONDUCTOR DEVICE

(75) Inventors: Satoshi Hirose, Nishikamo-gun (JP);
Daigo Kikuta, Aichi-gun (JP)

(73) Assignee: Toyota Jidosha Kabushiki Kaisha,
Aichi-ken (JP)

( * ) Notice: Subject to any disclaimer, the term of this patent is extended or adjusted under 35 U.S.C. 154(b) by 386 days.

(21) Appl. No.: 12/599,192

(22) PCT Filed: Jun. 11, 2008

(86) PCT No.: PCT/JP2008/061082
§ 371 (c)(1),
(2), (4) Date: Nov. 6, 2009

(87) PCT Pub. No.: WO2008/153195
PCT Pub. Date: Dec. 18, 2008

(65) Prior Publication Data
US 2010/0219785 A1  Sep. 2, 2010

(30) Foreign Application Priority Data

Jun. 12, 2007  (JP) ................. 2007-155454

(51) Int. Cl.
*H01L 29/66* (2006.01)
(52) U.S. Cl. ............ 257/378; 257/341; 257/E29.197; 438/270; 361/91.1
(58) Field of Classification Search ............ 257/341, 257/378, 379, 381, 516, E29.197, E21.382, 257/E29.218; 438/270; 361/91
See application file for complete search history.

(56) References Cited

U.S. PATENT DOCUMENTS

| 5,721,148 | A | * | 2/1998 | Nishimura ............... 438/270 |
| 5,828,100 | A |   | 10/1998 | Tamba et al. |
| 5,946,178 | A | * | 8/1999 | Bijlenga ................ 361/91.5 |
| 6,002,566 | A | * | 12/1999 | Arikawa et al. .......... 361/93.1 |
| 6,204,717 | B1 |  | 3/2001 | Nagasu et al. |
| 2003/0001657 | A1 | * | 1/2003 | Worley et al. ............ 327/514 |
| 2003/0094642 | A1 | * | 5/2003 | Houston et al. ........... 257/296 |
| 2004/0180500 | A1 | * | 9/2004 | Metzler ................. 438/270 |
| 2005/0029993 | A1 | * | 2/2005 | Hadizad ................ 323/223 |
| 2005/0151187 | A1 |  | 7/2005 | Wakimoto et al. |
| 2006/0244060 | A1 | * | 11/2006 | Kapels et al. ............ 257/341 |

FOREIGN PATENT DOCUMENTS

DE  102004055879 A1  12/2009

(Continued)

OTHER PUBLICATIONS

Office Action issued in copending German Application No. DE 11 2008 001 550.3 on Aug. 17, 2012.

*Primary Examiner* — William F Kraig
(74) *Attorney, Agent, or Firm* — Sughrue Mion, PLLC

(57) ABSTRACT

An inverter for driving a motor includes a plurality of power semiconductor devices. The plurality of power semiconductor devices include a resistance electrically connected between a collector and an emitter of an IGBT element. Each of the power semiconductor devices forms any one of a U-phase arm, a V-phase arm and a W-phase arm of the inverter. As a result, a discharge resistance is built in the inverter, and therefore, it is not required to prepare the discharge resistance separately. Thus, the number of components required for a motor drive apparatus can be decreased and the number of operation steps can be reduced.

4 Claims, 31 Drawing Sheets

FOREIGN PATENT DOCUMENTS

| | | |
|---|---|---|
| JP | 60-062149 A | 4/1985 |
| JP | 61-180472 A | 8/1986 |
| JP | 05-003289 A | 1/1993 |
| JP | 05003289 A * | 1/1993 |
| JP | 07-170776 A | 7/1995 |
| JP | 08-335522 A | 12/1996 |
| JP | 09-082954 A | 3/1997 |
| JP | 09-083326 A | 3/1997 |
| JP | 2004039838 A | 5/2004 |
| JP | 2005-073399 A | 3/2005 |
| JP | 2005-143259 A | 6/2005 |
| JP | 2006-042459 A | 2/2006 |
| JP | 2006-042498 A | 2/2006 |
| JP | 2006-332182 A | 12/2006 |
| JP | 2006332182 A * | 12/2006 |

* cited by examiner

US 8,324,691 B2

POWER SEMICONDUCTOR DEVICE

TECHNICAL FIELD

The present invention relates to a power semiconductor device, a method for manufacturing a power semiconductor device, and a motor drive apparatus. The present invention, in particular, relates to a technique for allowing cost reduction of a motor drive apparatus including an inverter.

BACKGROUND ART

There is a type of a motor drive apparatus that converts, by an inverter, direct current (DC) electric power supplied from a DC power supply such as a battery and uses the converted electric power to drive and control a motor. Such a motor drive apparatus generally includes a smoothing capacitor that is connected between a power supply line and an earth line for stabilizing a DC voltage input to the inverter.

In the above motor drive apparatus, for safety reasons, it is required to surely discharge the electric charge stored in the smoothing capacitor when electric power feeding to a load stops. Therefore, in many cases, a discharge resistance for discharging the smoothing capacitor is connected between the power supply line and the earth line in parallel with the smoothing capacitor.

In order to discharge the smoothing capacitor as soon as possible, it is required to minimize a resistance value of the discharge resistance. On the other hand, if the resistance value of the discharge resistance is small, a current flowing through the discharge resistance is increased when a power supply device supplies electric power to the load. Therefore, power consumption of the discharge resistance is increased.

Japanese Patent Laying-Open No. 7-170776 discloses a method for discharging electric charge in a main circuit of an inverter, which is designed for solving such contradictory problems. The main circuit of the inverter disclosed in this document includes: a rectifier connected to a motor and rectifying an output of an alternating current (AC) power supply; a contactor for turning on/off a DC voltage output of the rectifier; a capacitor for smoothing the DC voltage output of the rectifier; a switching element for converting the DC voltage to a three-phase pulse voltage obtained by nearly sinusoidal PWM (Pulse Width Modulation) and supplying the pulse voltage to the motor; and a discharge resistance connected in parallel with the capacitor. At the time of discharge of the capacitor, the contactor is first turned off, and then, the switching element is turned on. As a result, a current in the main circuit flows through an exciting winding of the motor, and therefore, the capacitor can be discharged rapidly even if a resistance value of the discharge resistance remains high.

Since the discharge resistance is provided to the inverter, problems such as an increase in the number of components required for the motor drive apparatus and the necessity for an installation step arise. These problems become an impediment to cost reduction of the motor drive apparatus.

DISCLOSURE OF THE INVENTION

An object of the present invention is to provide a power semiconductor device that allows cost reduction of a motor drive apparatus.

In summary, the present invention is directed to a power semiconductor device, including: first and second main electrodes formed on first and second main surfaces of a semiconductor substrate, respectively; a power semiconductor element formed in the semiconductor substrate and electrically connected to the first and second main electrodes; and a resistance element formed in the semiconductor substrate and electrically connected to the first and second main electrodes in parallel with the power semiconductor element.

Preferably, the power semiconductor element includes a first control electrode configured to control a current flowing between the first and second main electrodes, in accordance with a first control voltage.

More preferably, the power semiconductor element is an insulating gate bipolar transistor. The resistance element is a fixed resistance.

More preferably, the power semiconductor element is an insulating gate bipolar transistor. The resistance element is a depletion-type MOSFET. The depletion-type MOSFET has a second control electrode configured to change a resistance value of the depletion-type MOSFET itself, in accordance with a second control voltage.

More preferably, the semiconductor substrate has a first conductivity type. The power semiconductor element further includes a first region of a second conductivity type formed on the first main surface of the semiconductor substrate, a second region of the second conductivity type formed on the second main surface of the semiconductor substrate and sandwiching a low concentration region that is a region of the first conductivity type in the semiconductor substrate, between the second region and the first region, and a third region of the first conductivity type formed to overlap the first region in the first main surface. A first trench extending from the first main surface through the third and first regions to the low concentration region as well as a second trench surrounding a predetermined region in the first main surface and formed more deeply than the first trench are formed in the semiconductor substrate. The first control electrode is formed inside the first trench to face the first region, the third region and the low concentration region with an insulating film interposed. The resistance element includes a fourth region of the first conductivity type formed in the predetermined region, and a fifth region of the first conductivity type buried under the fourth region and formed such that a resistance value per unit volume is higher than that of the low concentration region. The first main electrode is electrically connected to the first, third and fourth regions. The second main electrode is electrically connected to the second region.

Further preferably, the power semiconductor device further includes an insulating layer formed to fill the second trench.

More preferably, the semiconductor substrate has a first conductivity type. The power semiconductor element further includes a first region of a second conductivity type formed on the first main surface of the semiconductor substrate, a second region of the second conductivity type formed on the second main surface of the semiconductor substrate and sandwiching a low concentration region that is a region of the first conductivity type in the semiconductor substrate, between the second region and the first region, and a third region of the first conductivity type formed to overlap the first region in the first main surface. A first trench extending from the first main surface through the third and first regions to the low concentration region as well as a second trench surrounding a predetermined region in the first main surface and formed more deeply than the first trench are formed in the semiconductor substrate. The first control electrode is formed inside the first trench to face the first region, the third region and the low concentration region with a first insulating film interposed. The resistance element is a depletion-type MOSFET. The resistance element includes a fourth region of the first conductivity type formed in the predetermined region, a fifth region of the first conductivity type that is a portion surrounded by the second trench in the low concentration region, a second insulating film formed to cover at least a sidewall of the second trench, and a second control electrode formed to face the fourth and fifth regions with the second insulating film interposed. The first main electrode is electrically connected to the first, third and fourth regions. The second main electrode is electrically connected to the second region.

More preferably, the semiconductor substrate has a first conductivity type. The power semiconductor element further includes a first region of a second conductivity type formed on the first main surface of the semiconductor substrate, a second region of the second conductivity type formed on the second main surface of the semiconductor substrate and sandwiching a low concentration region that is a region of the first conductivity type in the semiconductor substrate, between the second region and the first region, and a third region of the first conductivity type formed to overlap the first region in the first main surface. A first trench extending from the first main surface through the third and first regions to the low concentration region, an isolation region of the second conductivity type surrounding a predetermined region in the first main surface and extending from the first main surface through the first region to the low concentration region, and a second trench extending from the first main surface through the first region to the low concentration region within the predetermined region are formed in the semiconductor substrate. The first control electrode is formed inside the first trench to face the first region, the third region and the low concentration region with a first insulating film interposed. The resistance element is a depletion-type MOSFET. The resistance element includes a fourth region of the first conductivity type formed in the predetermined region, a fifth region of the first conductivity type that is a portion surrounded by the isolation region in the low concentration region, a second insulating film formed to cover at least a sidewall of the second trench, and a second control electrode formed to face the fourth and fifth regions with the second insulating film interposed. The first main electrode is electrically connected to the first, third and fourth regions. The second main electrode is electrically connected to the second region.

According to another aspect of the present invention, the present invention is directed to a motor drive apparatus for driving a motor by supplying an AC voltage to the motor. The motor drive apparatus includes an inverter device, a power supply, a power line, and a capacitor. An inverter device converts a DC voltage to the AC voltage and supplies the AC voltage to the motor. The inverter device includes a plurality of power semiconductor devices. Each of the plurality of power semiconductor devices has first and second main electrodes formed on first and second main surfaces of a semiconductor substrate, respectively, a power semiconductor element formed in the semiconductor substrate and electrically connected to the first and second main electrodes, and a resistance element formed in the semiconductor substrate and electrically connected to the first and second main electrodes in parallel with the power semiconductor element. The power supply supplies the DC electric power to the inverter device. The power line is provided between the inverter device and the power supply. The capacitor is connected to the power line.

Preferably, the power semiconductor element includes a first control electrode configured to control a current flowing between the first and second main electrodes, in accordance with a first control voltage.

More preferably, the power semiconductor element is an insulating gate bipolar transistor. The resistance element is a fixed resistance.

More preferably, the power semiconductor element is an insulating gate bipolar transistor. The resistance element is a depletion-type MOSFET. The depletion-type MOSFET has a second control electrode configured to change a resistance value of the depletion-type MOSFET itself, in accordance with a second control voltage.

Further preferably, the motor drive apparatus further includes a controller for controlling a conduction state and a non-conduction state of the depletion-type MOSFET by providing the second control voltage to the second control electrode.

Further preferably, the controller sets the depletion-type MOSFET included in each of the plurality of power semiconductor devices to the non-conduction state, when the inverter device is normal, and sets the depletion-type MOSFET included in each of the plurality of power semiconductor devices to the conduction state, when the inverter device is abnormal.

Further preferably, the motor includes a plurality of coils corresponding to a plurality of phases, respectively. Each of the plurality of power semiconductor devices forms any one of a plurality of arms provided correspondingly to the plurality of coils, respectively. The motor drive apparatus further includes a plurality of temperature sensors provided correspondingly to the plurality of arms and detecting a temperature of a corresponding arm. The controller specifies one arm having the lowest temperature among the plurality of arms, based on a result of detection by each of the plurality of temperature sensors, and sets the depletion-type MOSFET included in the power semiconductor device forming the one arm to the conduction state, and sets the depletion-type MOSFET included in the power semiconductor device forming another arm to the non-conduction state.

According to still another aspect of the present invention, the present invention is directed to a method for manufacturing a power semiconductor device, including the steps of: on a first main surface of a semiconductor substrate of a first conductivity type, forming a first region of a second conductivity type; forming a second region of the second conductivity type on a second main surface of the semiconductor substrate to sandwich a low concentration region that is a region of the first conductivity type in the semiconductor substrate, between the second region and the first region; forming a third region of the first conductivity type in the first region in the first main surface by selective ion implantation; forming a fourth region of the first conductivity type in the first region in the first main surface by selective ion implantation; forming a crystal defect region in a portion located immediately under the fourth region in the low concentration region, by irradiation with electron beams or ions; forming a first trench extending from the first main surface through the third and first regions to the low concentration region, by selective anisotropic etching of the third region in the first main surface; forming a second trench to surround the fourth region and the crystal defect region, by selective anisotropic etching of the first main surface; forming a control electrode layer inside the first trench to face the first region, the third region and the low concentration region with an insulating film interposed; forming a first main electrode to be electrically connected to the first, third and fourth regions; and forming a second main electrode to be electrically connected to the second region.

Preferably, the method for manufacturing a power semiconductor device further includes the step of forming an insulating layer to fill the second trench.

According to a further aspect of the present invention, the present invention is directed to a method for manufacturing a power semiconductor device, including the steps of: on a first main surface of a semiconductor substrate of a first conductivity type, forming a first region of a second conductivity type; forming a second region of the second conductivity type on a second main surface of the semiconductor substrate to sandwich a low concentration region that is a region of the first conductivity type in the semiconductor substrate, between the second region and the first region; forming a third region of the first conductivity type in the first region in the first main surface by selective ion implantation; forming a fourth region of the first conductivity type in the first region in the first main surface by selective ion implantation; forming a first trench extending from the first main surface through the third and first regions to the low concentration region, by selective anisotropic etching of the third region in the first main surface; forming a second trench surrounding the fourth region and extending from the first main surface through the first region to the low concentration region, by selective anisotropic etching of the first main surface; forming a first control electrode layer inside the first trench to face the first and third regions and the low concentration region with a first insulating film interposed; forming a second control electrode layer inside the second trench to face the fourth region and the low concentration region with a second insulating film interposed; forming a first main electrode to be electrically connected to the first, third and fourth regions; and forming a second main electrode to be electrically connected to the second region.

According to a further aspect of the present invention, the present invention is directed to a method for manufacturing a power semiconductor device, including the steps of: on a first main surface of a semiconductor substrate of a first conductivity type, forming a first region of a second conductivity type; forming a second region of the second conductivity type on a second main surface of the semiconductor substrate to sandwich a low concentration region that is a region of the first conductivity type in the semiconductor substrate, between the second region and the first region; forming a third region of the first conductivity type in the first region in the first main surface by selective ion implantation; forming a fourth region of the first conductivity type in the first region in the first main surface by selective ion implantation; forming a first trench extending from the first main surface through the third and first regions to the low concentration region, by selective anisotropic etching of the third region in the first main surface; forming an isolation region of the second conductivity type to surround the fourth region, by selective ion implantation into the first main surface; forming a second trench extending from the first main surface through the fourth region to the low concentration region, by selective anisotropic etching of the fourth region in the first main surface; forming a first control electrode layer inside the first trench to face the first region, the third region and the low concentration region with a first insulating film interposed; forming a second control electrode layer inside the second trench to face the fourth region and the low concentration region with a second insulating film interposed; forming a first main electrode to be electrically connected to the first, third and fourth regions; and forming a second main electrode to be electrically connected to the second region.

Therefore, according to the present invention, cost reduction of the motor drive apparatus can be achieved.

BEST MODES FOR CARRYING OUT THE INVENTION

Figure 1:
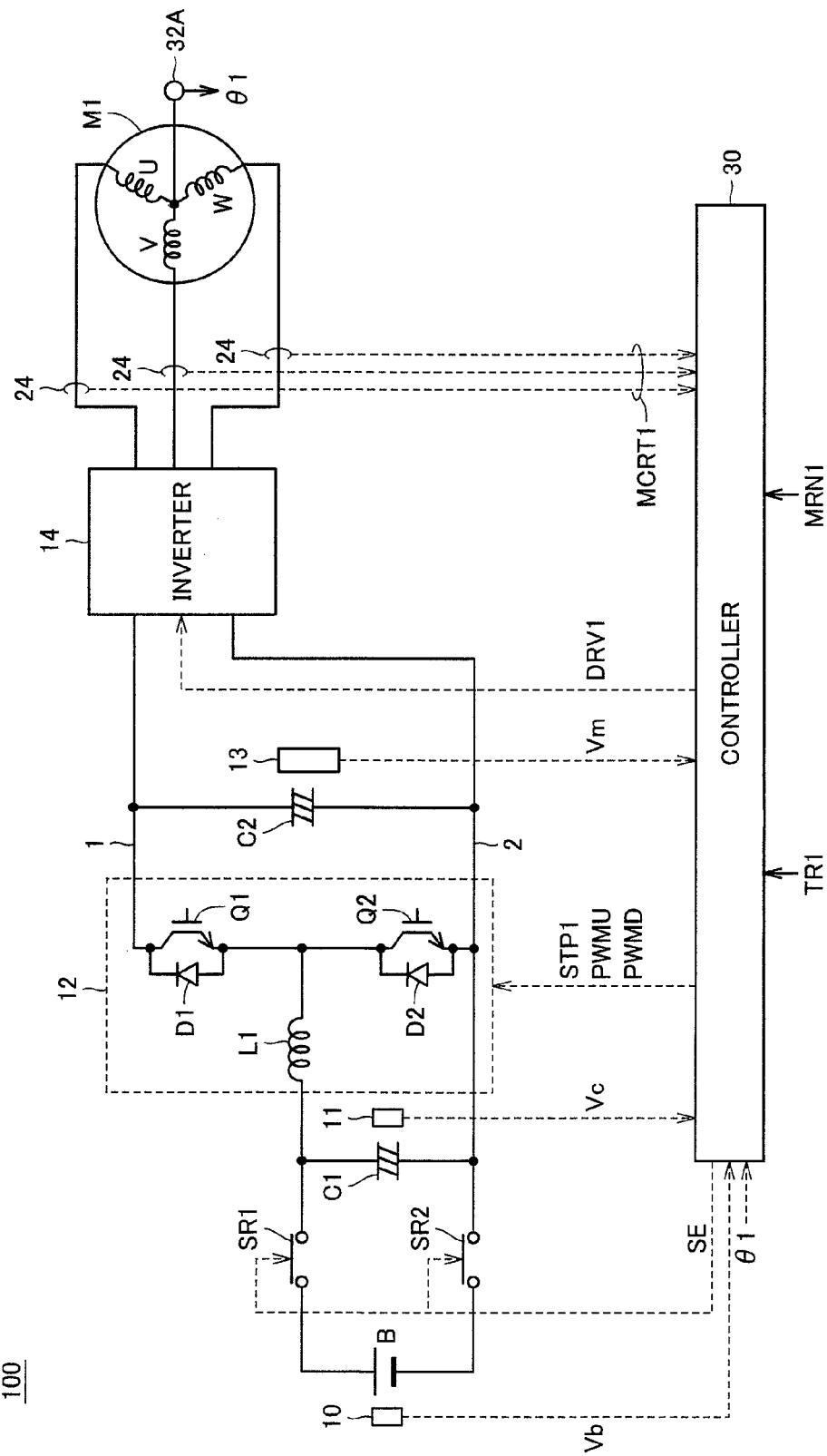
FIG. 1 is a schematic block diagram of a motor drive apparatus of a first embodiment.

Embodiments of the present invention will be described hereinafter with reference to the drawings. In the following description, the same components will be represented by the same reference characters. Their names and functions are also the same. Therefore, detailed description on them will not be repeated.

First Embodiment

FIG. 1 is a schematic block diagram of a motor drive apparatus of a first embodiment. Referring to FIG. 1, a motor drive apparatus 100 includes a DC power supply B, system relays SR1 and SR2, a power supply line 1, an earth line 2, voltage sensors 10, 11 and 13, capacitors C1 and C2, a boost converter 12, an inverter 14, a current sensor 24, and a controller 30.

An AC motor M1 is a drive motor that generates torque for driving drive wheels (not shown) of a hybrid vehicle or an electric vehicle. Alternatively, AC motor M1 may be incorporated into the hybrid vehicle as a motor generator having a function as a generator that is operated by an engine and serving as a motor that can start the engine. AC motor M1 has a U-phase coil, a V-phase coil and a W-phase coil.

DC power supply B outputs a DC voltage. DC power supply B includes, for example, a secondary battery such as a nickel hydride battery or a lithium ion battery. Voltage sensor 10 detects a voltage Vb output from DC power supply B and outputs detected voltage Vb to controller 30.

System relays SR1 and SR2 are turned on by a signal SE from controller 30. When system relays SR1 and SR2 are turned on, the DC voltage from DC power supply B is supplied to capacitor C1. Capacitor C1 smoothes the DC voltage supplied from DC power supply B through system relays SR1 and SR2, and supplies the smoothed DC voltage to boost converter 12. Voltage sensor 11 detects a voltage Vc across capacitor C1 and outputs detected voltage Vc to controller 30.

Boost converter 12 includes a reactor L1, IGBT (Insulated Gate Bipolar transistor) elements Q1 and Q2, and diodes D1 and D2. Reactor L1 has one end connected to the power supply line of DC power supply B, and the other end connected to an intermediate point between IGBT element Q1 and IGBT element Q2, that is, between an emitter of IGBT element Q1 and a collector of IGBT element Q2. IGBT elements Q1 and Q2 are connected in series between power supply line 1 and earth line 2. IGBT element Q1 has a collector connected to power supply line 1, and IGBT element Q2 has an emitter connected to earth line 2. Furthermore, diodes D1 and D2 for passing a current from the emitter side to the collector side are arranged between the collectors and the emitters of IGBT elements Q1 and Q2, respectively.

In response to turning on/off of IGBT elements Q1 and Q2 by controller 30, boost converter 12 boosts the DC voltage supplied from capacitor C1, and supplies the output voltage to capacitor C2. Furthermore, during regenerative braking of the hybrid vehicle or the electric vehicle, boost converter 12 steps down a DC voltage generated by AC motor M1 and converted by inverter 14, and supplies the DC voltage to capacitor C1.

Capacitor C2 is connected between power supply line 1 and earth line 2. Capacitor C2 smoothes the DC voltage supplied from boost converter 12, and supplies the smoothed DC voltage to inverter 14. Voltage sensor 13 detects a voltage across capacitor C2, that is, an output voltage Vm of boost converter 12.

When the DC voltage is supplied from capacitor C2, inverter 14 converts the DC voltage to an AC voltage based on a signal DRV1 from controller 30, and supplies the AC voltage to AC motor M1 to drive AC motor M1. As a result, AC motor M1 is driven to generate torque specified by a torque command value TR1. Furthermore, during regenerative braking of the hybrid vehicle (or the electric vehicle) having motor drive apparatus 100 mounted thereon, inverter 14 converts an AC voltage generated by AC motor M1 to a DC voltage based on signal DRV1 from controller 30, and supplies the converted DC voltage to boost converter 12 through capacitor C2.

A rotation angle detecting unit 32A is arranged at AC motor M1. Rotation angle detecting unit 32A is coupled to a rotation shaft of AC motor M1. Rotation angle detecting unit 32A detects a rotation angle θ1 based on a rotational position of a rotor of AC motor M1, and outputs detected rotation angle θ1 to controller 30.

Controller 30 receives torque command value TR1 and a motor rotation speed MRN1 from an externally-provided ECU (Electrical Control Unit). Controller 30 further receives voltage Vb from voltage sensor 10, voltage Vc from voltage sensor 11, voltage Vm from voltage sensor 13, and a motor current MCRT1 from current sensor 24. Controller 30 further receives rotation angle θ1 from rotation angle detecting unit 32A.

Controller 30 generates signal DRV1 for controlling switching of a power semiconductor device included in inverter 14 when inverter 14 drives AC motor M1, based on voltage Vm, motor current MCRT1, torque command value TR1, and rotation angle θ1. Controller 30 outputs generated signal DRV1 to inverter 14.

When inverter 14 drives AC motor M1, controller 30 generates a signal PWMU for controlling switching of IGBT elements Q1 and Q2 in boost converter 12, based on voltages Vb and Vm, torque command value TR1, and motor rotation speed MRN1. Controller 30 outputs generated signal PWMU to boost converter 12.

During regenerative braking of the hybrid vehicle (or the electric vehicle) having motor drive apparatus 100 mounted thereon, controller 30 generates signal DRV1 for converting an AC voltage generated by AC motor M1 to a DC voltage. Controller 30 outputs signal DRV1 to inverter 14. In this case, switching of the power semiconductor device in inverter 14 is controlled by signal DRV1. As a result, inverter 14 converts the AC voltage generated by AC motor M1 to the DC voltage, and supplies the DC voltage to boost converter 12.

In addition, controller 30 generates a signal PWMD for stepping down the DC voltage supplied from inverter 14, and outputs generated signal PWMD to boost converter 12. As a result, the AC voltage generated by AC motor M1 is converted to the DC voltage, and the DC voltage is stepped down and supplied to DC power supply B.

Moreover, when the operation of boost converter 12 stops, controller 30 generates a signal STP1, and outputs generated signal STP1 to boost converter 12. As a result, the switching operation of IGBT elements Q1 and Q2 included in boost converter 12 stops.

Figure 2:
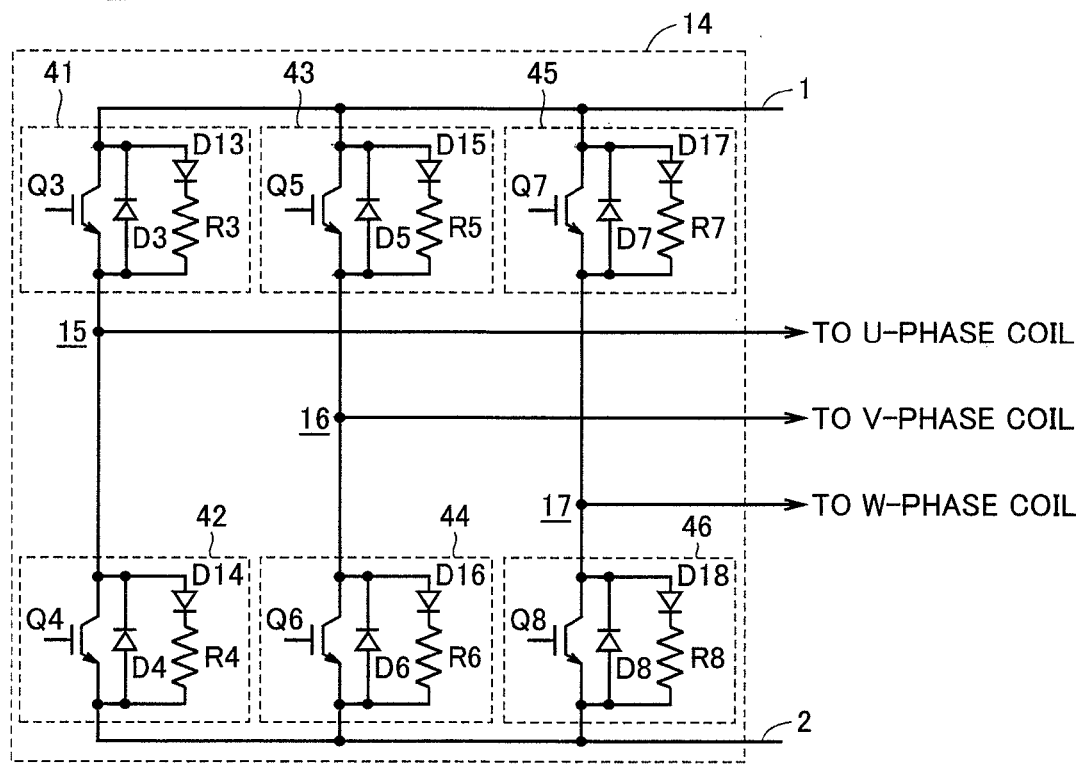
FIG. 2 illustrates a structure of an inverter 14 in FIG. 1.

FIG. 2 illustrates a structure of inverter 14 in FIG. 1. Referring to FIG. 2, inverter 14 includes a U-phase arm 15, a V-phase arm 16 and a W-phase arm 17. U-phase arm 15, V-phase arm 16 and W-phase arm 17 are provided in parallel between power supply line 1 and earth line 2. It is noted that U-phase arm 15, V-phase arm 16 and W-phase arm 17 are provided correspondingly to the U-phase coil, the V-phase coil and the W-phase coil of AC motor M1, respectively.

U-phase arm 15 includes power semiconductor devices 41 and 42 connected in series between power supply line 1 and earth line 2. V-phase arm 16 includes power semiconductor devices 43 and 44 connected in series between power supply line 1 and earth line 2. W-phase arm 17 includes power semiconductor devices 45 and 46 connected in series between power supply line 1 and earth line 2.

An intermediate point of each phase arm of inverter 14 is connected to each phase end of each phase coil of AC motor M1. In other words, an intermediate point between power semiconductor devices 41 and 42 is connected to one end of the U-phase coil of AC motor M1, an intermediate point between power semiconductor devices 43 and 44 is connected to one end of the V-phase coil, and an intermediate point between power semiconductor devices 45 and 46 is connected to one end of the W-phase coil.

Power semiconductor devices 41 to 46 have the same structure. Therefore, in the following, power semiconductor devices 41 and 42 forming the U-phase arm will be described in detail as a typical example, and each of power semiconductor devices 43 to 46 will be described mainly in terms of differences between power semiconductor devices 43 to 46 and power semiconductor device 41 (or 42).

Power semiconductor device 41 includes an IGBT element Q3, diodes D3 and D13, and a resistance R3. IGBT element Q3 has a collector connected to power supply line 1, and an emitter connected to one end of the U-phase coil. Diode D3 for passing a current from the emitter side to the collector side is arranged between the collector and the emitter of IGBT element Q3.

Diode D13 and resistance R3 are connected in series between the collector and the emitter of IGBT element Q3. Diode D13 has an anode connected to the collector side of IGBT element Q3, and a cathode connected to one end of resistance R3. The other end of resistance R3 is connected to the emitter of IGBT element Q3. As a result, one end and the other end of resistance R3 are electrically connected to the collector and the emitter of IGBT element Q3, respectively.

Power semiconductor device 42 includes an IGBT element Q4, diodes D4 and D14, and a resistance R4. IGBT element Q4 has a collector connected to one end of the U-phase coil, and an emitter connected to earth line 2. Diode D4 for passing a current from the emitter side to the collector side is arranged between the collector and the emitter of IGBT element Q4.

In addition, diode D14 and resistance R4 are connected in series between the collector and the emitter of IGBT element Q4. Diode D14 has an anode connected to the collector of IGBT element Q4, and a cathode connected to one end of resistance R4. The other end of resistance R4 is connected to the emitter of IGBT element Q3. As a result, one end and the other end of resistance R4 are electrically connected to the collector and the emitter of IGBT element Q3, respectively.

Power semiconductor device 43 has a structure in which IGBT element Q3, diode D3, diode D13, and resistance R3 included in power semiconductor device 41 are replaced with an IGBT element Q5, a diode D5, a diode D15, and a resistance R5, respectively. IGBT element Q5 has an emitter connected to one end of the V-phase coil.

Power semiconductor device 44 has a structure in which IGBT element Q4, diode D4, diode D14, and resistance R4 included in power semiconductor device 42 are replaced with an IGBT element Q6, a diode D6, a diode D16, and a resistance R6, respectively. IGBT element Q6 has a collector connected to one end of the V-phase coil.

Power semiconductor device 45 has a structure in which IGBT element Q3, diode D3, diode D13, and resistance R3 included in power semiconductor device 41 are replaced with an IGBT element Q7, a diode D7, a diode D17, and a resistance R7, respectively. IGBT element Q7 has an emitter connected to one end of the W-phase coil.

Power semiconductor device 46 has a structure in which IGBT element Q4, diode D4, diode D14, and resistance R4 included in power semiconductor device 42 are replaced with an IGBT element Q8, a diode D8, a diode D18, and a resistance R8, respectively. IGBT element Q8 has a collector connected to one end of the W-phase coil.

Next, resistances R3 to R8 will be described in detail. Resistances R3 and R4 are connected in series between power supply line 1 and earth line 2. As shown in FIG. 1, capacitor C2 is connected between power supply line 1 and earth line 2. Therefore, series-connected resistances R3 and R4 serve as a discharge resistance of capacitor C2.

Similarly, between power supply line 1 and earth line 2, resistances R5 and R6 are connected in series, and in addition, resistances R7 and R8 are connected in series. Therefore, series-connected resistances R3 and R4 as well as series-connected resistances R5 and R6 both serve as a discharge resistance of capacitor C2.

Figure 3:
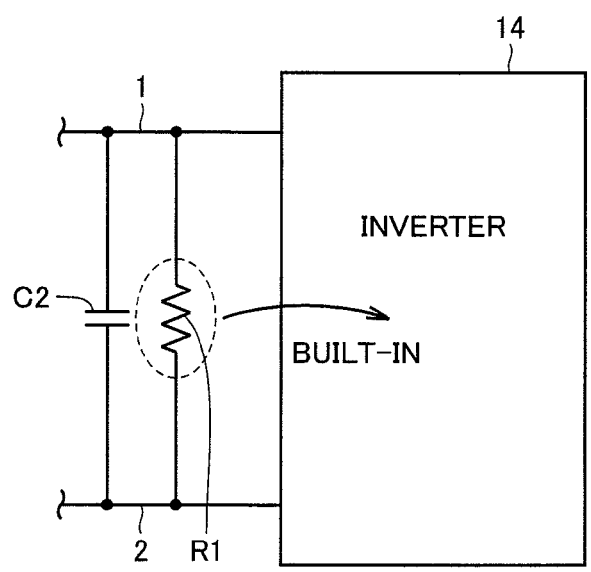
FIG. 3 illustrates features of the present embodiment.

FIG. 3 illustrates features of the present embodiment. Referring to FIG. 3, inverter 14 is connected to power supply line 1 and earth line 2. Capacitor C2 is connected between power supply line 1 and earth line 2.

Resistance R1 serves as a discharge resistance for discharging capacitor C2 and is connected between power supply line 1 and earth line 2. In many cases, a discharge resistance such as resistance R1 is provided separately from the inverter. There arises, however, a problem of an increase in the number of components required for the motor drive apparatus because it is required to prepare the discharge resistance separately from the inverter. In addition, there arises a problem of the necessity for an operation step of connecting the discharge resistance between power supply line 1 and earth line 2.

As shown in FIG. 2, in the present embodiment, the resistance electrically connected between the collector and the emitter of the IGBT element is built in the power semiconductor device. The power semiconductor device forms any one of the U-phase arm, the V-phase arm and the W-phase arm of inverter 14. As a result, the discharge resistance is built in inverter 14, and therefore, it is not required to prepare the discharge resistance separately. Thus, the number of components required for the motor drive apparatus can be decreased and the number of operation steps can be reduced, and consequently, cost reduction of the motor drive apparatus can be achieved.

During discharge of capacitor C2, a current flows through the discharge resistance, and therefore, the discharge resistance generates heat. As a result, the temperature of the discharge resistance is raised. The rise in the temperature of the discharge resistance may cause damage to the discharge resistance itself or an influence on its surroundings. According to the present embodiment, if there is a cooling device for cooling the inverter, the cooling device can cool the discharge resistance. Therefore, the occurrence of these problems can be prevented.

In addition, in the present embodiment, six lines of discharge paths are formed by resistances R3 to R8 during discharge of the smoothing capacitor, and therefore, redundancy of the discharge paths can be increased. As a result of the increase in redundancy of the discharge paths, a current flowing only through a particular resistance during discharge of the capacitor can be prevented. Consequently, a rise in the temperature of each resistance can be suppressed, and therefore, an influence on the motor drive apparatus can be reduced.

A structure of power semiconductor device 41 of the present embodiment will then be described in more detail.

Figure 4:
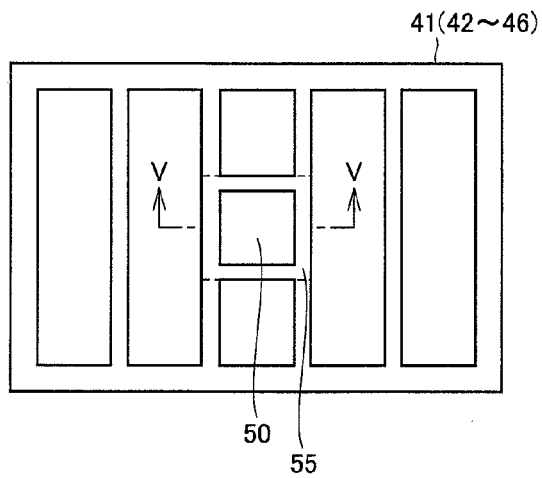
FIG. 4 is a plan view of a power semiconductor device 41 in FIG. 2.

FIG. 4 is a plan view of power semiconductor device 41 in FIG. 2. Referring to FIG. 4, power semiconductor device 41 includes a resistance region 50 formed in a semiconductor substrate in the form of a chip. In this semiconductor substrate, IGBT element Q3 (not shown in FIG. 4) is formed in a region around the resistance region. It is noted that each of power semiconductor devices 42 to 46 has a structure similar to that of power semiconductor device 41.

In FIG. 4, resistance region 50 is formed substantially in the center of a main surface of the semiconductor substrate. Arrangement of resistance region 50, however, is not limited to the arrangement shown in FIG. 4. For example, a plurality of resistance regions may be arranged discretely in the main surface of the semiconductor substrate. In this case, concentration of a current in the semiconductor substrate can be prevented, and therefore, a local rise in the temperature of the semiconductor substrate can be prevented. As a result, the probability of damage to power semiconductor device 41 can be reduced.

Figure 5:
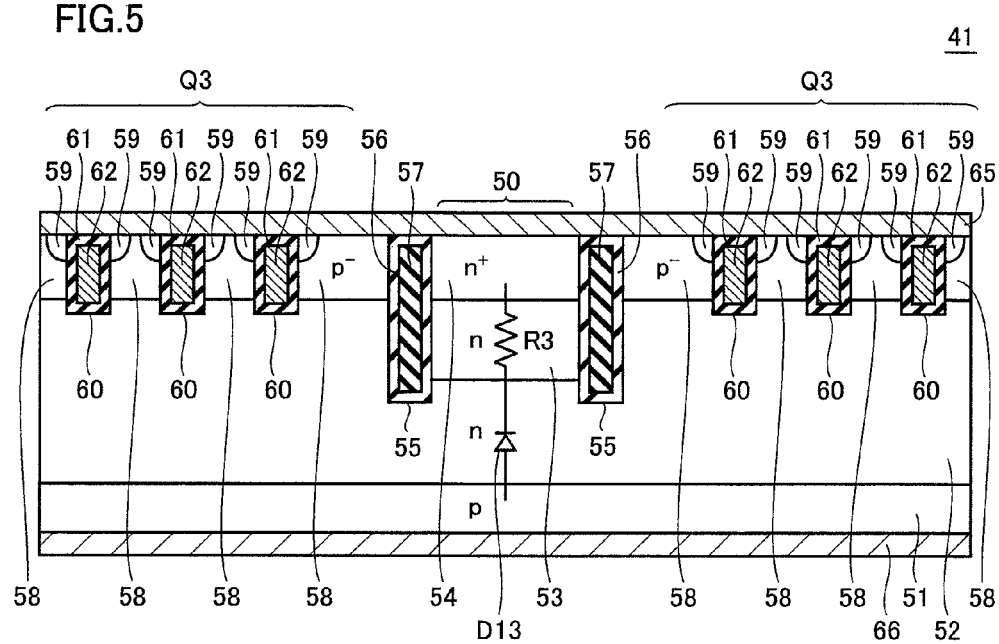
FIG. 5 is a cross-sectional view taken along line V-V in FIG. 4.

FIG. 5 is a cross-sectional view taken along line V-V in FIG. 4. Referring to FIGS. 5 and 4, power semiconductor device 41 includes main electrodes 65 and 66 formed on first and second main surfaces of the semiconductor substrate, respectively, IGBT element Q3 formed in the semiconductor substrate, and resistance R3 formed in the semiconductor substrate and connected between main electrodes 65 and 66 in parallel with IGBT element Q3. It is noted that main electrodes 65 and 66 are electrodes connected to the emitter and the collector of the IGBT element, respectively.

IGBT element Q3 includes an n-type region 52 that is a semiconductor substrate of a first conductivity type, a p$^-$-type region 58 (a first region) that is a region of a second conductivity type formed on the first main surface of the semiconductor substrate, and a p-type region 51 (a second region) that is a region of the second conductivity type formed on the second main surface of the semiconductor substrate.

P-type region 51 is formed to sandwich n-type region 52 (low concentration region) between p-type region 51 and p$^-$-type region 58. P-type region 51 corresponds to the collector of IGBT element Q3. P-type region 51 is electrically connected to main electrode 66.

A trench 60 (a first trench) extending from the first main surface through p$^-$-type region 58 to n-type region 52 as well as a trench 55 (a second trench) having a greater depth from the first main surface to the bottom than that of trench 60 and surrounding resistance region 50 are formed in the semiconductor substrate.

An insulating film 56 and an insulating layer 57 are formed inside trench 55. It is noted that the formation of insulating film 56 and insulating layer 57 inside trench 55 is not necessarily required. The formation of insulating film 56 and insulating layer 57 inside trench 55, however, allows the enhancement of the effect of preventing leakage of a current flowing through resistance region 50 into IGBT element Q3.

IGBT element Q3 further includes an n-type emitter region 59 (a third region) formed to overlap p$^-$-type region 58 in the first main surface of the semiconductor substrate and to contact a sidewall of trench 60. P$^-$-type region 58 and n-type emitter region 59 are electrically connected to main electrode 65.

A control electrode layer 62 is formed inside trench 60 to face n-type emitter region 59, p$^-$-type region 58 and n-type region 52 with an insulating film 61 interposed therebetween. Insulating film 61 serves as a gate insulating film of IGBT element Q3. IGBT element Q3 controls a current flowing between main electrodes 65 and 66, in accordance with a control voltage supplied from controller 30 in FIG. 1 to control electrode layer 62.

Resistance region 50 includes an n-type resistance region 53 and an n$^+$-type contact region 54. N$^+$-type contact region 54 (a fourth region) contacts n-type resistance region 53 and main electrode 65. N-type resistance region 53 (a fifth region) is formed to contact n-type region 52. In other words, n-type resistance region 53 is formed to be buried immediately under n$^+$-type contact region 54. A resistance value per unit volume of n-type resistance region 53 is higher than that of n-type region 52.

It is noted that p-type region 51 and n-type region 52 form diode D13 connected to resistance R1 (see FIG. 2).

Steps of manufacturing the power semiconductor device of the first embodiment will then be described with reference to FIGS. 6 to 15.

Figure 6:
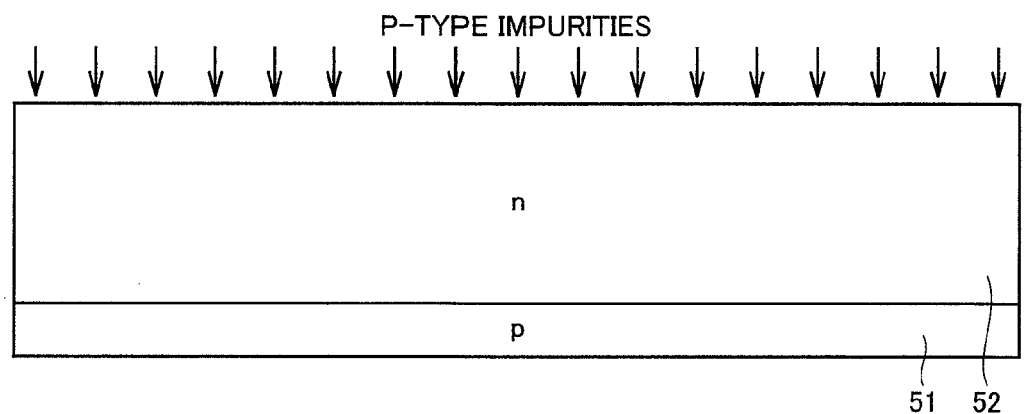
FIG. 6 is a schematic cross-sectional view showing a first step of a method for manufacturing the power semiconductor device of the first embodiment.

FIG. 6 is a schematic cross-sectional view showing a first step of a method for manufacturing the power semiconductor device of the first embodiment. Referring to FIG. 6, for example, p-type impurity ions (for example, boron (B) ions) are implanted on the second main surface side of an n-type semiconductor substrate, and then, the semiconductor substrate is subjected to heat treatment to form p-type region 51 and n-type region 52. It is noted that p-type region 51 and n-type region 52 may be formed by forming an n-type epitaxial layer on the surface of a p-type substrate. Next, the p-type impurity ions are implanted into the first main surface of the semiconductor substrate.

Figure 7:
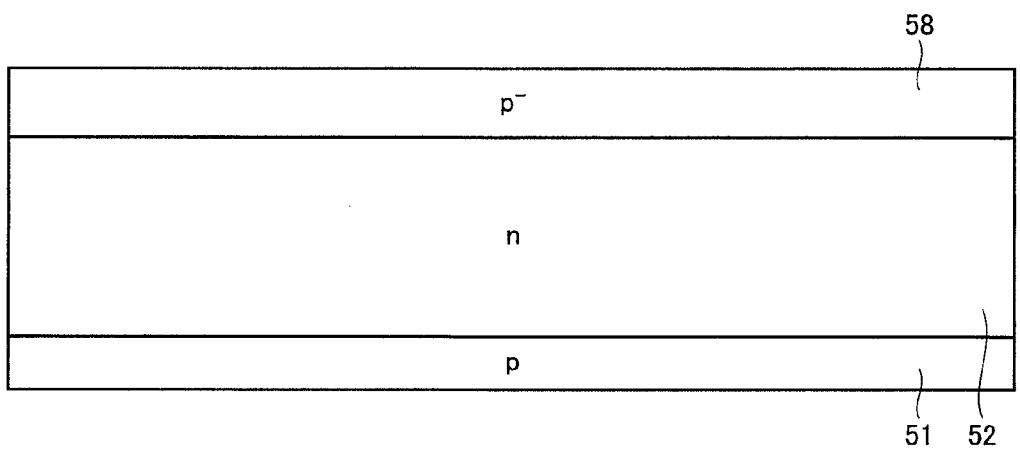
FIG. 7 is a schematic cross-sectional view showing a second step of the method for manufacturing the power semiconductor device of the first embodiment.

FIG. 7 is a schematic cross-sectional view showing a second step of the method for manufacturing the power semiconductor device of the first embodiment. Referring to FIG. 7, the heat treatment of the semiconductor substrate causes the p-type impurity ions implanted into the first main surface to diffuse. Thus, $p^-$-type region 58 is formed.

Figure 8:
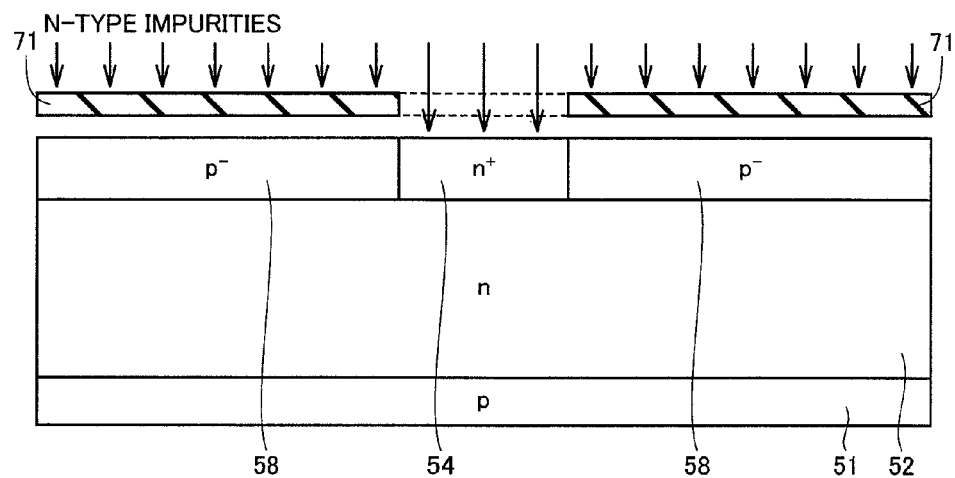
FIG. 8 is a schematic cross-sectional view showing a third step of the method for manufacturing the power semiconductor device of the first embodiment.

FIG. 8 is a schematic cross-sectional view showing a third step of the method for manufacturing the power semiconductor device of the first embodiment. Referring to FIG. 8, n-type impurity ions (for example, phosphorus (P) ions) are selectively implanted on the first main surface side of the semiconductor substrate by using a mask 71. It is noted that a photoresist may be used instead of the mask. By the subsequent heat treatment, $n^+$-type contact region 54 is formed to extend through $p^-$-type region 58. In FIG. 8, the implantation step and the heat treatment step are collectively shown in order to show the formation of $n^+$-type contact region 54 in an understandable manner.

Figure 9:
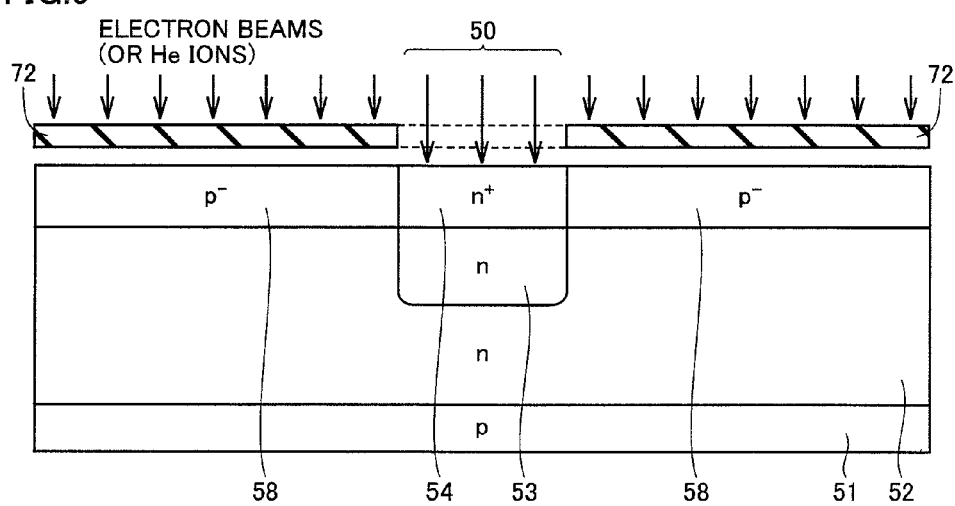
FIG. 9 is a schematic cross-sectional view showing a fourth step of the method for manufacturing the power semiconductor device of the first embodiment.

FIG. 9 is a schematic cross-sectional view showing a fourth step of the method for manufacturing the power semiconductor device of the first embodiment. Referring to FIG. 9, a region on the first main surface side of the semiconductor substrate overlapping $n^+$-type contact region 54 is selectively irradiated with electron beams or helium (He) ions by using a mask 72. The irradiation energy of the electrons or helium ions is defined such that the electrons or helium ions reach n-type region 52 through $n^+$-type contact region 54. By the irradiation with electron beams or helium ions, n-type resistance region 53 is formed under $n^+$-type contact region 54. $N^+$-type contact region 54 and n-type resistance region 53 constitute resistance region 50.

In n-type resistance region 53, a crystal defect occurs due to the irradiation with electron beams or helium ions. The mobility of carriers moving in a region where the crystal defect occurs is smaller than that of carriers moving in n-type region 52. Therefore, the resistance value per unit volume of n-type resistance region 53 (crystal defect region) is higher, as compared with the resistance value per unit volume of n-type region 52.

It is noted that the step of forming n-type resistance region 53 and the step of forming $n^+$-type contact region 54 may be performed in reverse order.

Furthermore, n-type resistance region 53 may be formed by implanting the p-type impurity ions having high energy into the bottom of $n^+$-type contact region 54.

Figure 10:
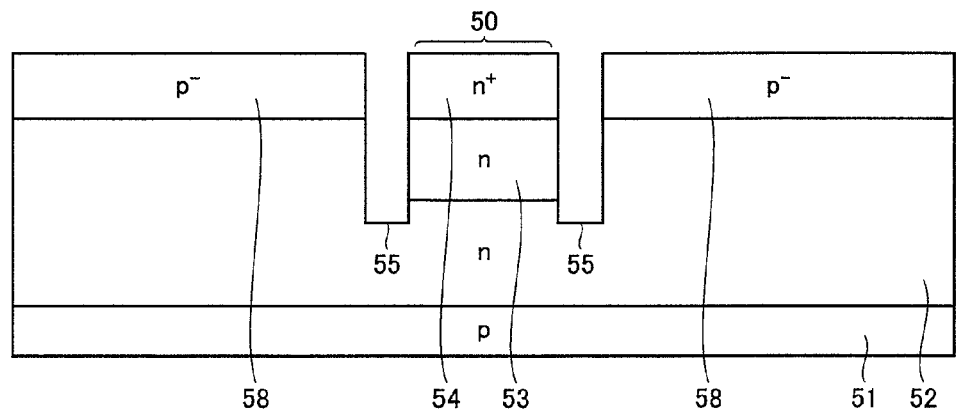
FIG. 10 is a schematic cross-sectional view showing a fifth step of the method for manufacturing the power semiconductor device of the first embodiment.

FIG. 10 is a schematic cross-sectional view showing a fifth step of the method for manufacturing the power semiconductor device of the first embodiment. Referring to FIG. 10, by selective anisotropic etching of a portion ($p^-$-type region 58) around $n^+$-type contact region 54 in the first main surface of the semiconductor substrate, trench 55 is formed to extend from the first main surface of the semiconductor substrate through type region 58 to n-type region 52.

It is noted that trench 55 is preferably formed more deeply than n-type resistance region 53 (crystal defect region). As a result, leakage of a current flowing through n-type resistance region 53 into a drift layer (n-type region 52) of IGBT element Q3 can be prevented. Thus, an influence on IGBT element Q3 (for example, latch-up or the like) can be prevented.

Figure 11:
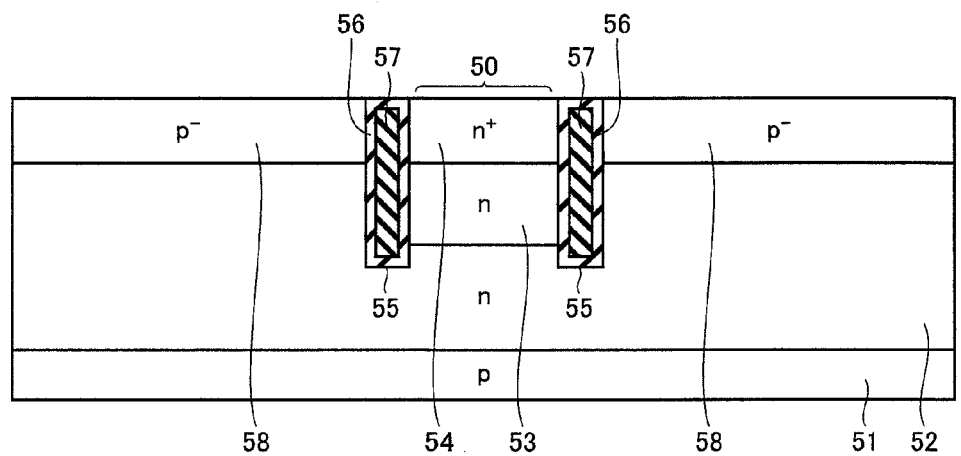
FIG. 11 is a schematic cross-sectional view showing a sixth step of the method for manufacturing the power semiconductor device of the first embodiment.

FIG. 11 is a schematic cross-sectional view showing a sixth step of the method for manufacturing the power semiconductor device of the first embodiment. Referring to FIG. 11, an inner surface of trench 55 is oxidized to form an oxide film inside trench 55. This oxide film forms insulating film 56. In addition, polycrystalline silicon that is not doped with impurities is deposited inside trench 55. Insulating layer 57 is formed by this polycrystalline silicon.

Figure 12:
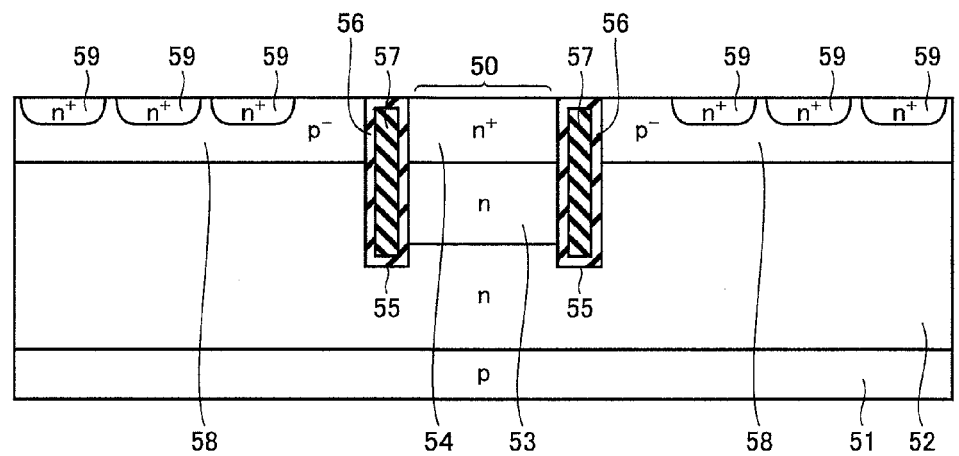
FIG. 12 is a schematic cross-sectional view showing a seventh step of the method for manufacturing the power semiconductor device of the first embodiment.

FIG. 12 is a schematic cross-sectional view showing a seventh step of the method for manufacturing the power semiconductor device of the first embodiment. Referring to FIG. 12, the n-type impurity ions are selectively implanted into $p^-$-type region 58. Next, the semiconductor substrate is subjected to heat treatment. As a result, n-type emitter region 59 is formed.

Figure 13:
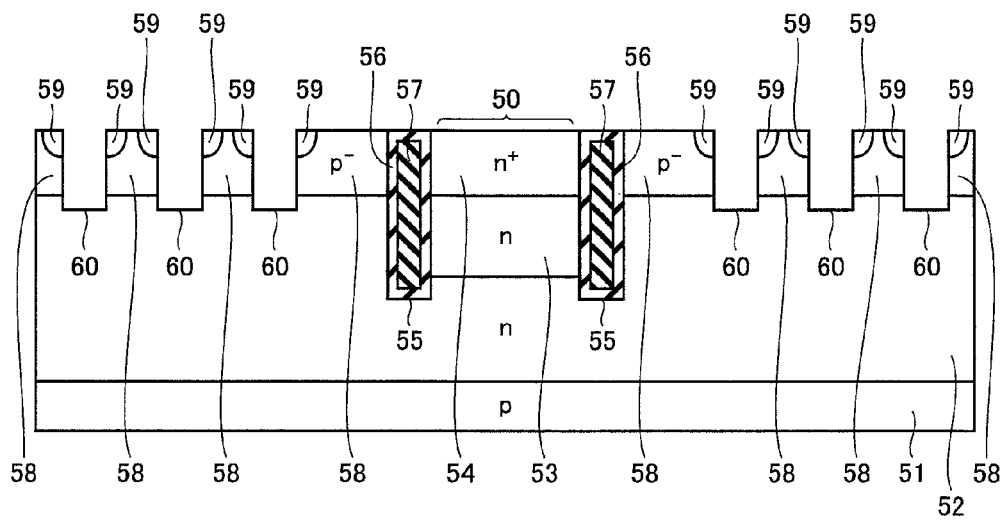
FIG. 13 is a schematic cross-sectional view showing an eighth step of the method for manufacturing the power semiconductor device of the first embodiment.

FIG. 13 is a schematic cross-sectional view showing an eighth step of the method for manufacturing the power semiconductor device of the first embodiment. Referring to FIG. 13, by anisotropic etching of a region where n-type emitter region 59 is formed in the first main surface of the semiconductor substrate, trench 60 is formed to extend from the first main surface of the semiconductor substrate through n-type emitter region 59 and $p^-$-type region 58 to n-type region 52.

Figure 14:
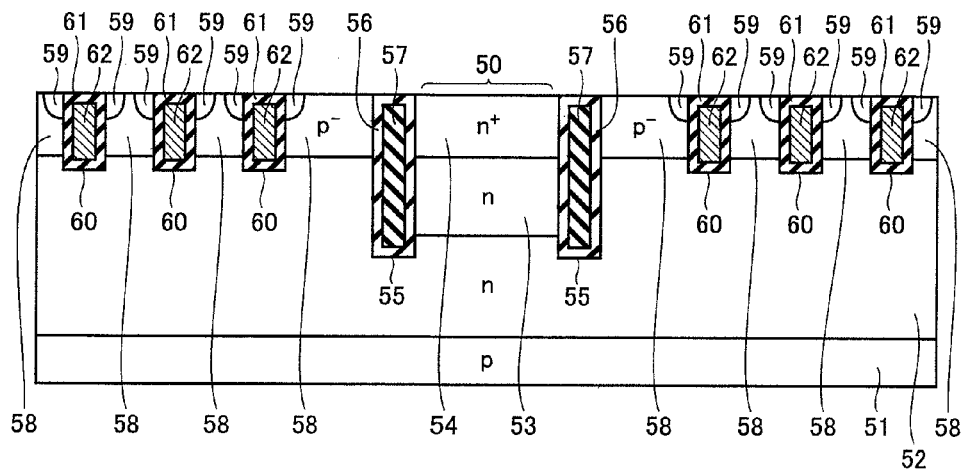
FIG. 14 is a schematic cross-sectional view showing a ninth step of the method for manufacturing the power semiconductor device of the first embodiment.

FIG. 14 is a schematic cross-sectional view showing a ninth step of the method for manufacturing the power semiconductor device of the first embodiment. Referring to FIG. 14, an inner surface of trench 60 is oxidized to form an oxide film inside trench 60. This oxide film forms insulating film 61 serving as a gate insulating film of IGBT element Q3. In addition, polycrystalline silicon doped with n-type impurities such as phosphorus (P) ions is deposited inside trench 60. Control electrode layer 62 is formed by this polycrystalline silicon.

Figure 15:
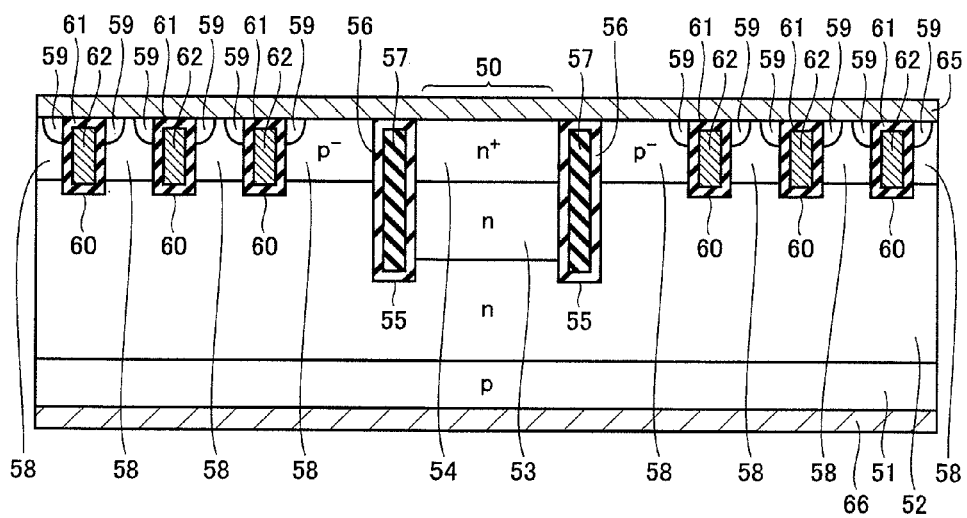
FIG. 15 is a schematic cross-sectional view showing a tenth step of the method for manufacturing the power semiconductor device of the first embodiment.

FIG. 15 is a schematic cross-sectional view showing a tenth step of the method for manufacturing the power semiconductor device of the first embodiment. Referring to FIG. 15, main electrode 65 is formed on the first main surface side of the semiconductor substrate to electrically connect $p^-$-type region 58, n-type emitter region 59 and $n^+$-type contact region 54. On the other hand, main electrode 66 is formed on the second main surface side of the semiconductor substrate to electrically connect p-type region 51. As a result, power semiconductor device 41 is completed.

As described above, according to the first embodiment, the power semiconductor device includes the first and second main electrodes formed on the first and second main surfaces of the semiconductor substrate, respectively, the power semiconductor element formed in the semiconductor substrate and electrically connected between the first and second main electrodes, and the resistance element electrically connected between the first and second main electrodes in parallel with the power semiconductor element. In addition, according to the first embodiment, the motor drive apparatus is equipped with the inverter including a plurality of power semiconductor devices described above. As a result, the discharge resistance external to the inverter (provided separately from the inverter) is not required, and therefore, cost reduction of the motor drive apparatus can be achieved.

Second Embodiment

Figure 16:
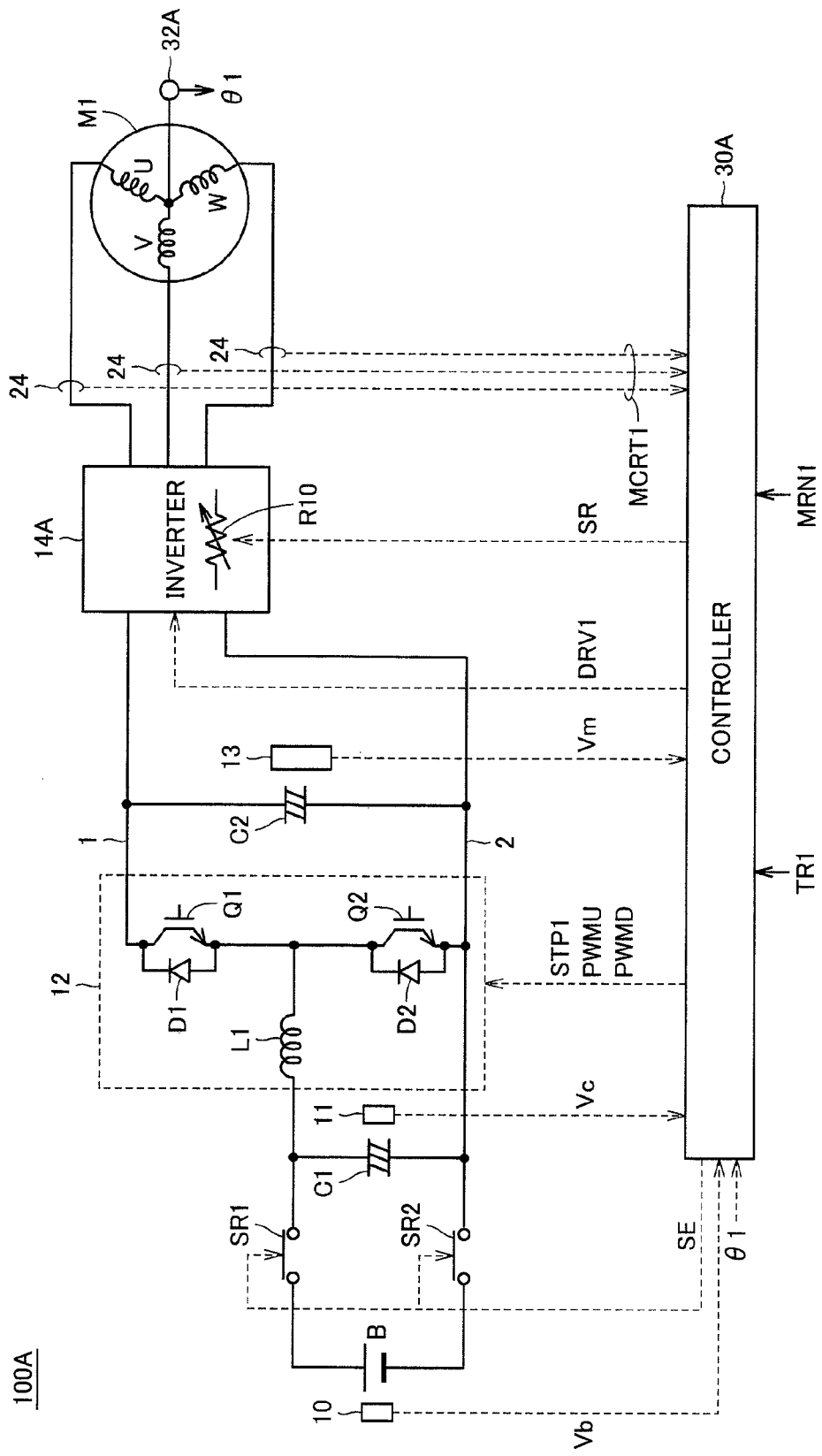
FIG. 16 is a schematic block diagram of a motor drive apparatus of a second embodiment.

FIG. 16 is a schematic block diagram of a motor drive apparatus of a second embodiment. Referring to FIGS. 16 and 1, a motor drive apparatus 100A differs from motor drive apparatus 100 in that motor drive apparatus 100A includes an inverter 14A and a controller 30A instead of inverter 14 and controller 30, respectively.

Inverter 14A differs from inverter 14 in that inverter 14A includes a variable resistance R10. Controller 30A outputs a signal SR to variable resistance R10. Variable resistance R10 changes a resistance value in response to signal SR.

It is noted that a structure of the other components in motor drive apparatus 100A is similar to that of motor drive apparatus 100, and therefore, description thereof will not be repeated hereinafter.

Next, a structure of inverter 14A and a structure of a power semiconductor device included in inverter 14A will be described in more detail.

Figure 17:
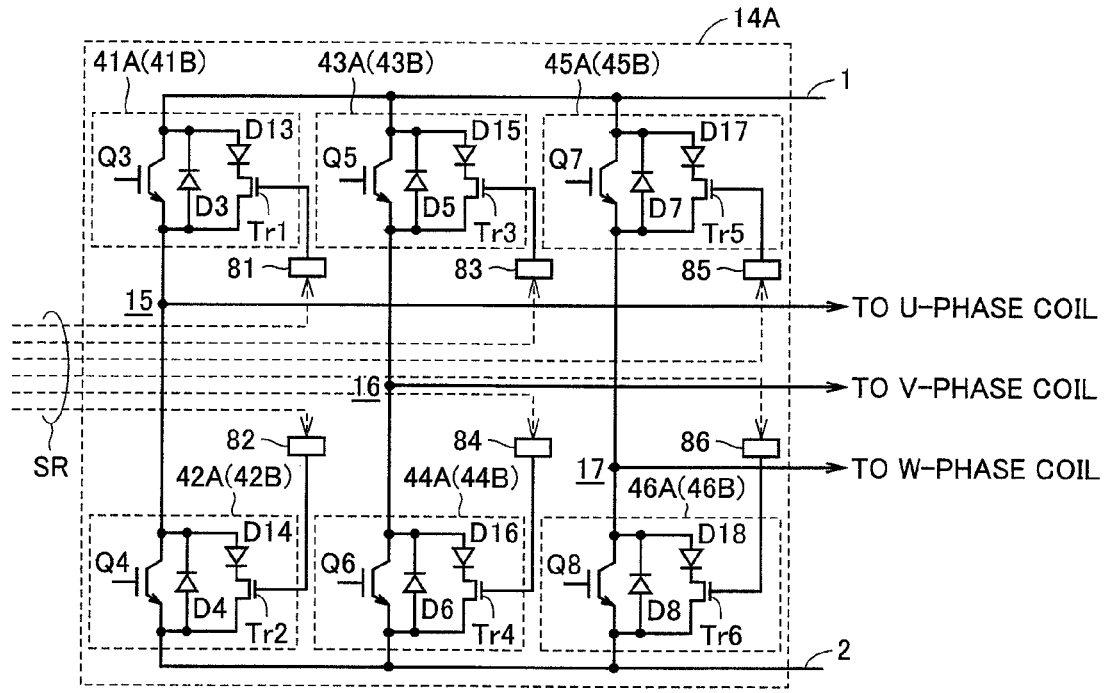
FIG. 17 illustrates a structure of an inverter 14A in FIG. 16 in detail.

FIG. 17 illustrates the structure of inverter 14A in FIG. 16 in detail. Referring to FIGS. 17 and 2, inverter 14A differs from inverter 14 in that inverter 14A includes power semiconductor devices 41A to 46A instead of power semiconductor devices 41 to 46.

Power semiconductor device 41A differs from power semiconductor device 41 in that power semiconductor device 41A includes a transistor Tr1 instead of resistance R3. Transistor Tr1 has one electrode connected to the cathode of diode D13, and the other electrode connected to the emitter of IGBT element Q3.

Specifically, transistor Tr1 is an n-type MOSFET (Metal Oxide Semiconductor Field Effect Transistor) and a depletion-type FET. Here, the depletion-type FET refers to an FET that is brought into conduction even if a voltage is not applied to a gate electrode.

With a change in an absolute value of a control voltage applied to the gate electrode, each of transistors Tr1 to Tr6 can change a resistance value between a drain and a source. In other words, each of transistors Tr1 to Tr6 serves as a variable resistance. Furthermore, when the absolute value of the control voltage has a predetermined magnitude, each of transistors Tr1 to Tr6 is brought out of conduction.

Similarly, a power semiconductor device 42A differs from power semiconductor device 42 in that power semiconductor device 42A includes transistor Tr2 instead of resistance R4. A power semiconductor device 43A differs from power semiconductor device 43 in that power semiconductor device 43A includes transistor Tr3 instead of resistance R5. A power semiconductor device 44A differs from power semiconductor device 44 in that power semiconductor device 44A includes transistor Tr4 instead of resistance R6. A power semiconductor device 45A differs from power semiconductor device 45 in that power semiconductor device 45A includes transistor Tr5 instead of resistance R7. A power semiconductor device 46A differs from power semiconductor device 46 in that power semiconductor device 46A includes transistor Tr6 instead of resistance R8. Each of transistors Tr2 to Tr6 is an n-type and depletion-type MOSFET similarly to transistor Tr1.

Inverter 14A further includes discharge resistance driving circuits 81 to 86 for driving transistors Tr1 to Tr6, respectively. Each of discharge resistance driving circuits 81 to 86 applies a control voltage to a gate electrode of a corresponding transistor in response to a signal from controller 30A shown in FIG. 16. It is noted that the signal provided to each of discharge resistance driving circuits 81 to 86 is included in signal SR in FIG. 16. Transistors Tr1 to Tr6 form variable resistance R10 shown in FIG. 16.

Figure 18:
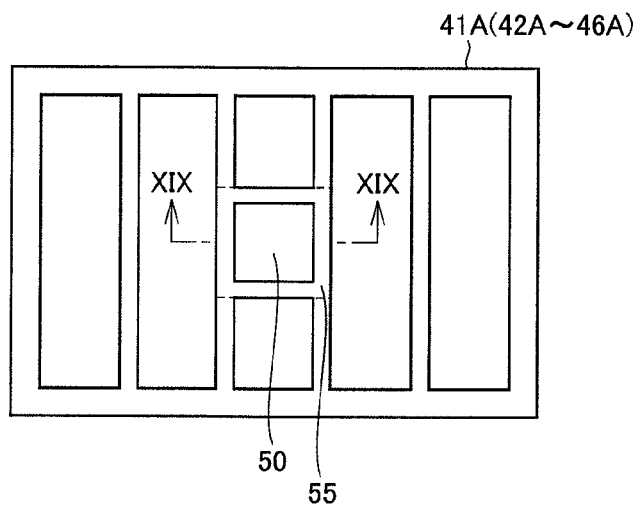
FIG. 18 is a plan view of a power semiconductor device 41A in FIG. 17.

FIG. 18 is a plan view of power semiconductor device 41A in FIG. 17. Referring to FIG. 18, power semiconductor device 41A includes resistance region 50 formed in a semiconductor substrate in the form of a chip. Similarly to the first embodiment, IGBT element Q3 is formed in a region around resistance region 50 in this semiconductor substrate. It is noted that each of power semiconductor devices 42A to 46A has a structure similar to that of power semiconductor device 41A.

Figure 19:
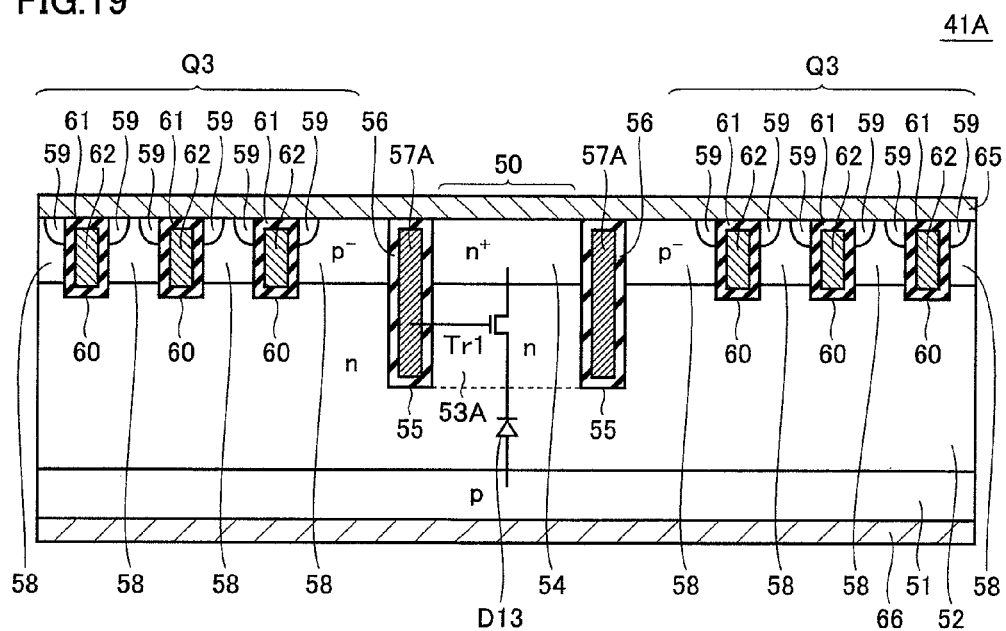
FIG. 19 is a cross-sectional view taken along line XIX-XIX in FIG. 18.

FIG. 19 is a cross-sectional view taken along line XIX-XIX in FIG. 18. Referring to FIGS. 19 and 5, power semiconductor device 41A differs from power semiconductor device 41 in that an n-type region 53A is formed instead of n-type resistance region 53 and in that a control electrode layer 57A is formed instead of insulating layer 57.

N-type region 53A is a part of n-type region 52 (low concentration region) surrounded by trench 55. Insulating film 56 forms a gate insulating film of transistor Tr1. Control electrode layer 57A forms a gate electrode of transistor Tr1. A portion in the vicinity of an interface between n-type region 53A and insulating film 56 corresponds to a channel of transistor Tr1. Application of a voltage to control electrode layer 57A causes a change in resistance of the channel. As a result, a resistance value of transistor Tr1 can be changed. It is noted that a structure of the other components in power semiconductor device 41A is similar to that of power semiconductor device 41, and therefore, description thereof will not be repeated hereinafter.

Steps of manufacturing power semiconductor device 41A of the second embodiment will then be described with reference to FIGS. 20 to 28. Detailed description of the steps common to the steps of manufacturing the power semiconductor device of the first embodiment, however, will not be repeated hereinafter.

Figure 20:
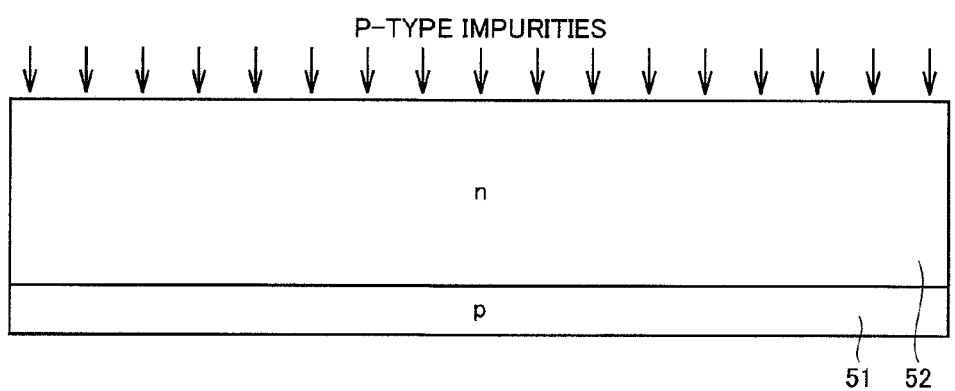
FIG. 20 is a schematic cross-sectional view showing a first step of a method for manufacturing power semiconductor device 41A of the second embodiment.

FIG. 20 is a schematic cross-sectional view showing a first step of a method for manufacturing power semiconductor device 41A of the second embodiment. Referring to FIG. 20, p-type region 51 and n-type region 52 are formed on the semiconductor substrate similarly to the first embodiment. Next, the p-type impurity ions are implanted into the first main surface of the semiconductor substrate.

Figure 21:
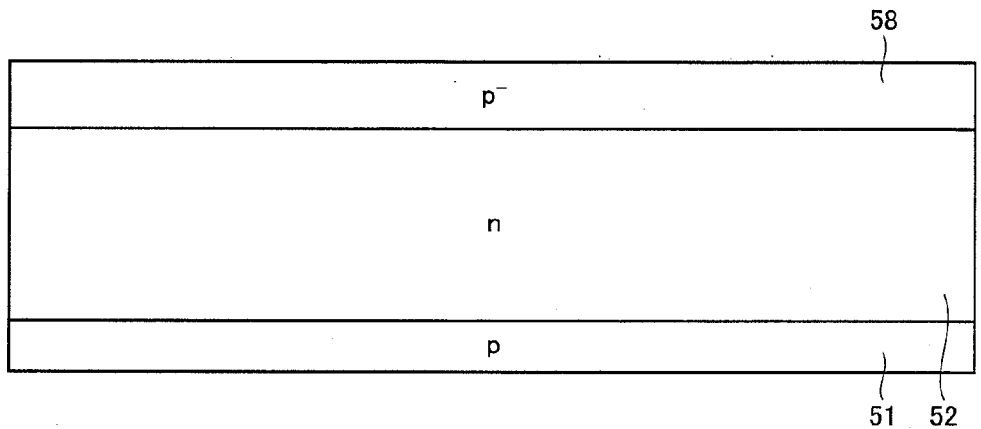
FIG. 21 is a schematic cross-sectional view showing a second step of the method for manufacturing power semiconductor device 41A of the second embodiment.

FIG. 21 is a schematic cross-sectional view showing a second step of the method for manufacturing power semiconductor device 41A of the second embodiment. Referring to FIG. 21, the heat treatment of the semiconductor substrate causes the p-type impurity ions implanted into the first main surface to diffuse. As a result, $p^-$-type region 58 is formed.

Figure 22:
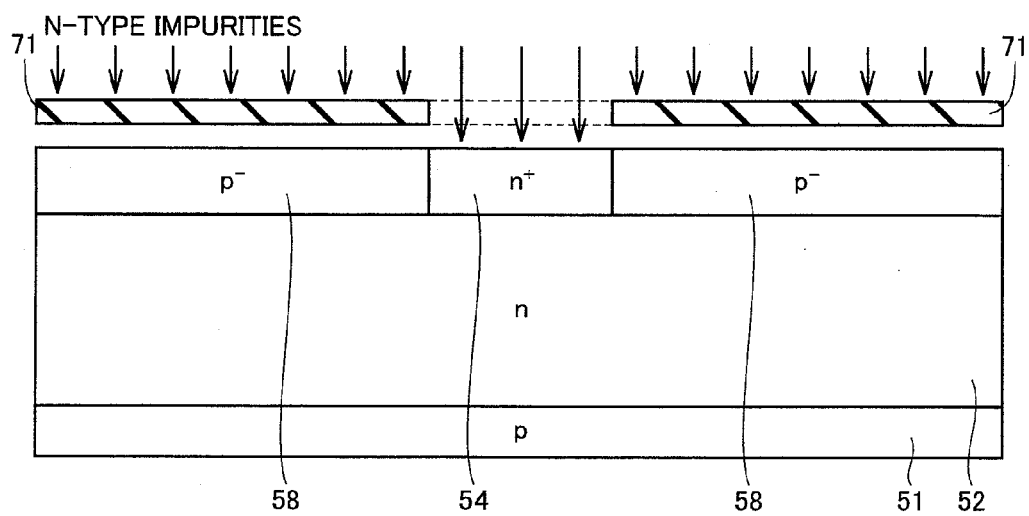
FIG. 22 is a schematic cross-sectional view showing a third step of the method for manufacturing power semiconductor device 41A of the second embodiment.

FIG. 22 is a schematic cross-sectional view showing a third step of the method for manufacturing power semiconductor device 41A of the second embodiment. Referring to FIG. 22, the n-type impurity ions are selectively implanted on the first main surface side of the semiconductor substrate by using mask 71 (the photoresist may be used). By the subsequent heat treatment, $n^+$-type contact region 54 is formed to extend through $p^-$-type region 58.

Figure 23:
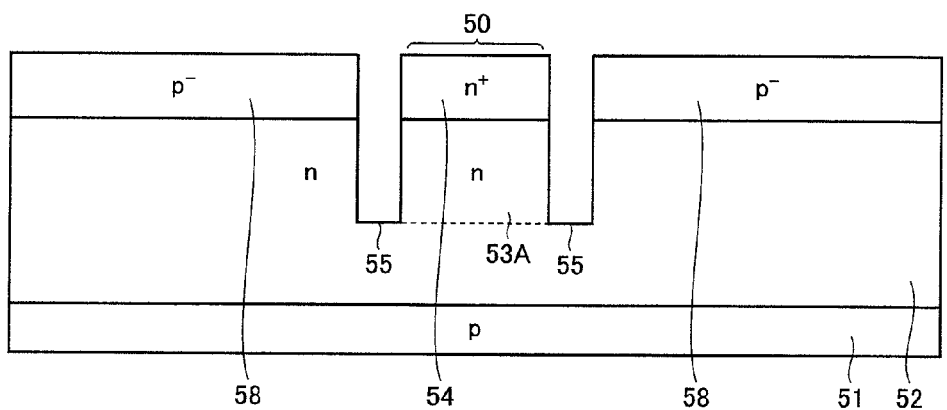
FIG. 23 is a schematic cross-sectional view showing a fourth step of the method for manufacturing power semiconductor device 41A of the second embodiment.

FIG. 23 is a schematic cross-sectional view showing a fourth step of the method for manufacturing power semiconductor device 41A of the second embodiment. Referring to FIG. 23, by selective anisotropic etching of a portion ($p^-$-type region 58) around $n^+$-type contact region 54 in the first main surface of the semiconductor substrate, trench 55 is formed to extend from the first main surface of the semiconductor substrate through $p^-$-type region 58 to n-type region 52. In addition, n-type region 53A is formed by trench 55.

Figure 24:
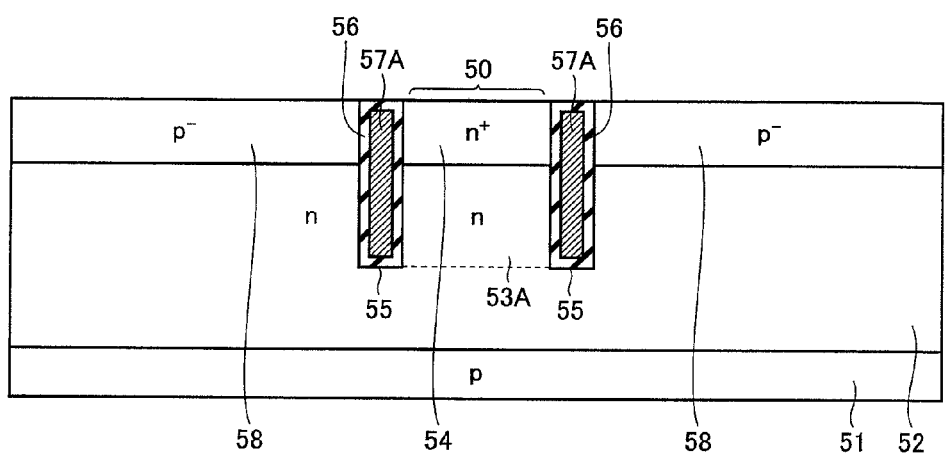
FIG. 24 is a schematic cross-sectional view showing a fifth step of the method for manufacturing power semiconductor device 41A of the second embodiment.

FIG. 24 is a schematic cross-sectional view showing a fifth step of the method for manufacturing power semiconductor device 41A of the second embodiment. Referring to FIG. 24, an inner surface of trench 55 is oxidized to form insulating film 56 (oxide film) inside trench 55. In addition, the polycrystalline silicon doped with the n-type impurities, for example, is deposited inside trench 55. Control electrode layer 57A is formed by this polycrystalline silicon.

Figure 25:
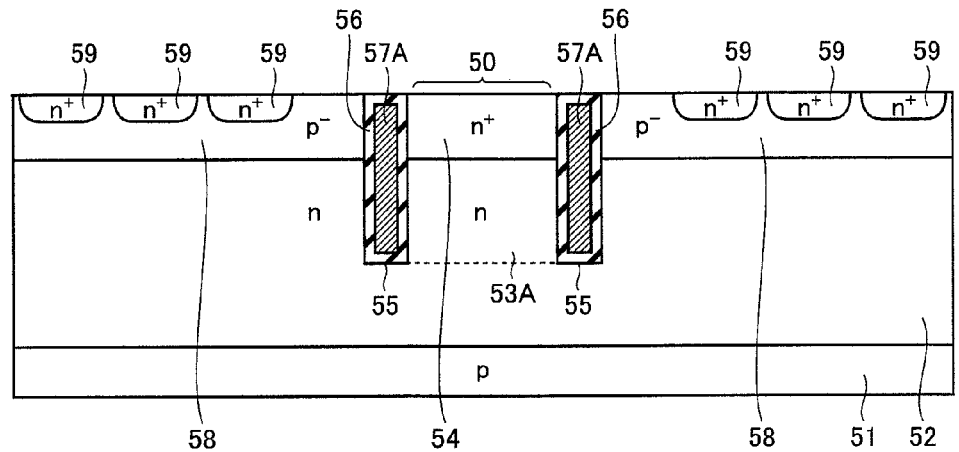
FIG. 25 is a schematic cross-sectional view showing a sixth step of the method for manufacturing power semiconductor device 41A of the second embodiment.

FIG. 25 is a schematic cross-sectional view showing a sixth step of the method for manufacturing power semiconductor device 41A of the second embodiment. Referring to FIG. 25, the n-type impurity ions are selectively implanted into p$^-$-type region 58. Next, the semiconductor substrate is subjected to heat treatment. As a result, n-type emitter region 59 is formed.

Figure 26:
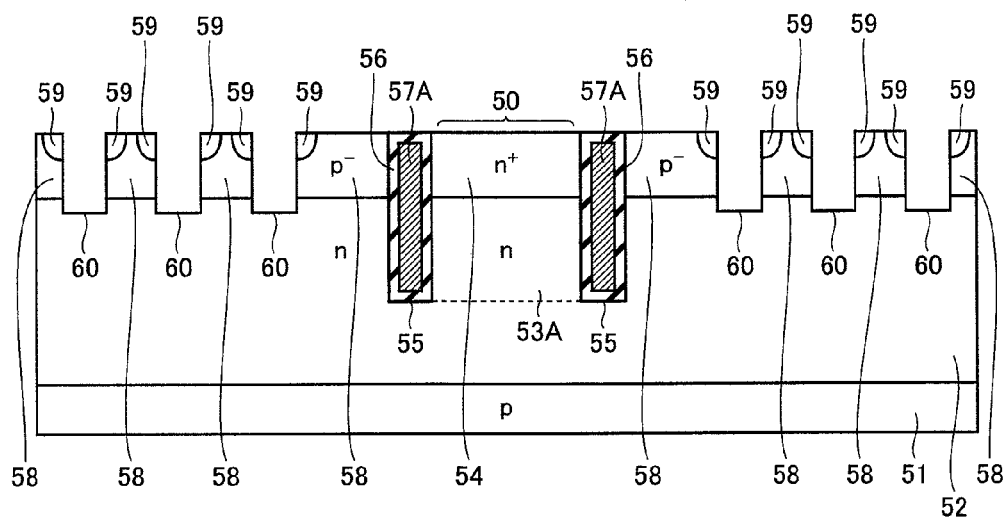
FIG. 26 is a schematic cross-sectional view showing a seventh step of the method for manufacturing power semiconductor device 41A of the second embodiment.

FIG. 26 is a schematic cross-sectional view showing a seventh step of the method for manufacturing power semiconductor device 41A of the second embodiment. Referring to FIG. 26, by anisotropic etching of a region where n-type emitter region 59 is formed in the first main surface of the semiconductor substrate, trench 60 is formed to extend from the first main surface of the semiconductor substrate through n-type emitter region 59 and p$^+$-type region 58 to n-type region 52.

Figure 27:
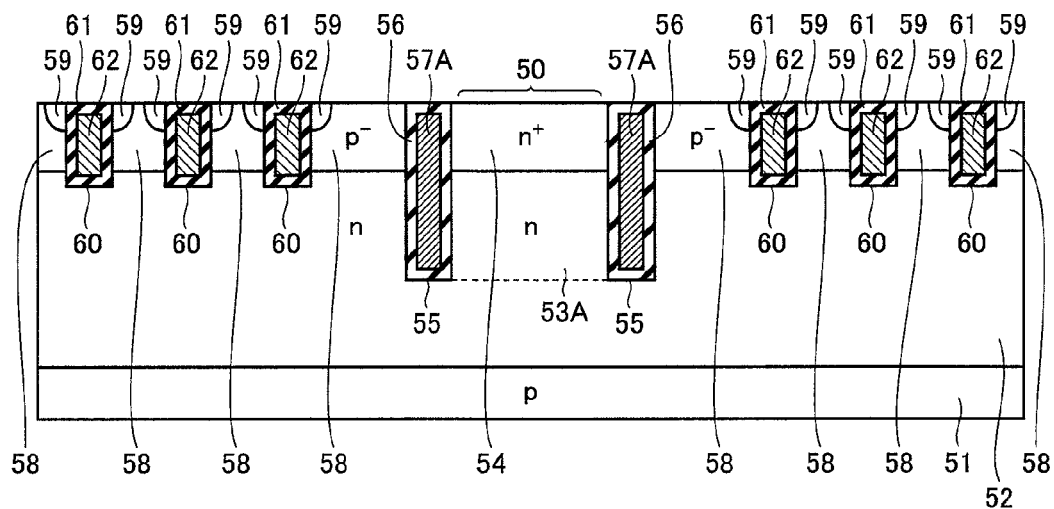
FIG. 27 is a schematic cross-sectional view showing an eighth step of the method for manufacturing power semiconductor device 41A of the second embodiment.

FIG. 27 is a schematic cross-sectional view showing an eighth step of the method for manufacturing power semiconductor device 41A of the second embodiment. Referring to FIG. 27, an inner surface of trench 60 is oxidized to form an oxide film (insulating film 61) inside trench 60. This oxide film serves as a gate insulating film of IGBT element Q3. In addition, the polycrystalline silicon doped with the n-type impurities, for example, is deposited inside trench 60. Control electrode layer 62 is formed by this polycrystalline silicon.

Figure 28:
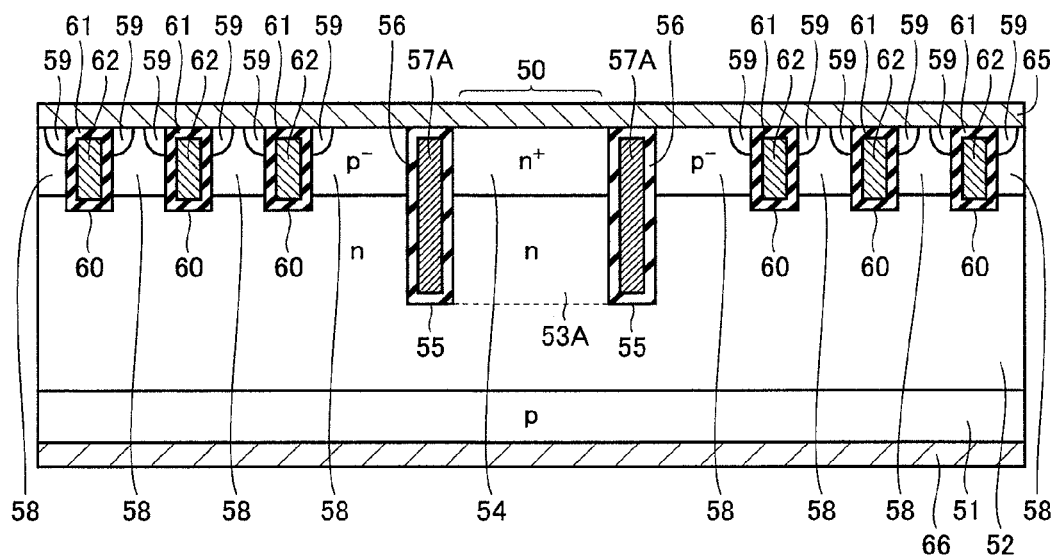
FIG. 28 is a schematic cross-sectional view showing a ninth step of the method for manufacturing power semiconductor device 41A of the second embodiment.

FIG. 28 is a schematic cross-sectional view showing a ninth step of the method for manufacturing power semiconductor device 41A of the second embodiment. Referring to FIG. 28, main electrode 65 is formed on the first main surface side of the semiconductor substrate to electrically connect p$^-$-type region 58, n-type emitter region 59 and n$^+$-type contact region 54. On the other hand, main electrode 66 is formed on the second main surface side of the semiconductor substrate to electrically connect p-type region 51. As a result, power semiconductor device 41A is completed.

<Modification of Power Semiconductor Device>

An example will be described hereinafter in which power semiconductor devices 41A to 46A included in inverter 14A in FIG. 17 are replaced with power semiconductor devices 41B to 46B (see FIG. 17). Power semiconductor devices 41B to 46B are equivalent to power semiconductor devices 41A to 46A, respectively. Power semiconductor devices 41B to 46B, however, differ from power semiconductor devices 41A to 46A in that an impurity diffusion region for isolating the IGBT element and the variable resistance (depletion-type MOSFET) is formed in the semiconductor substrate.

Figure 29:
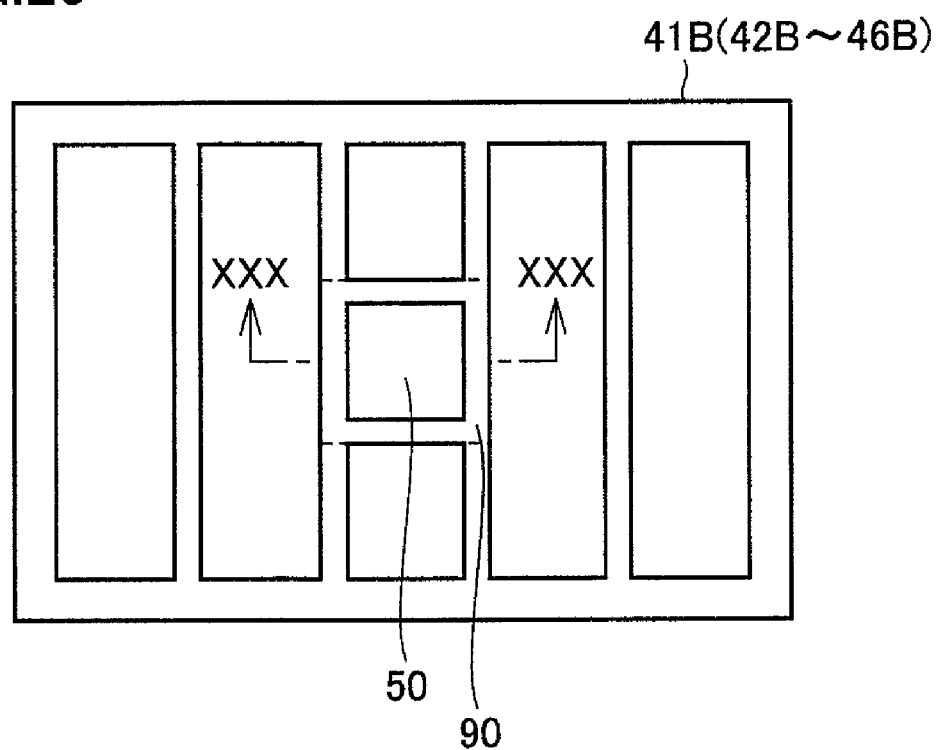
FIG. 29 illustrates a modification of the power semiconductor device according to the second embodiment.

FIG. 29 illustrates a modification of the power semiconductor device according to the second embodiment.

Figure 30:
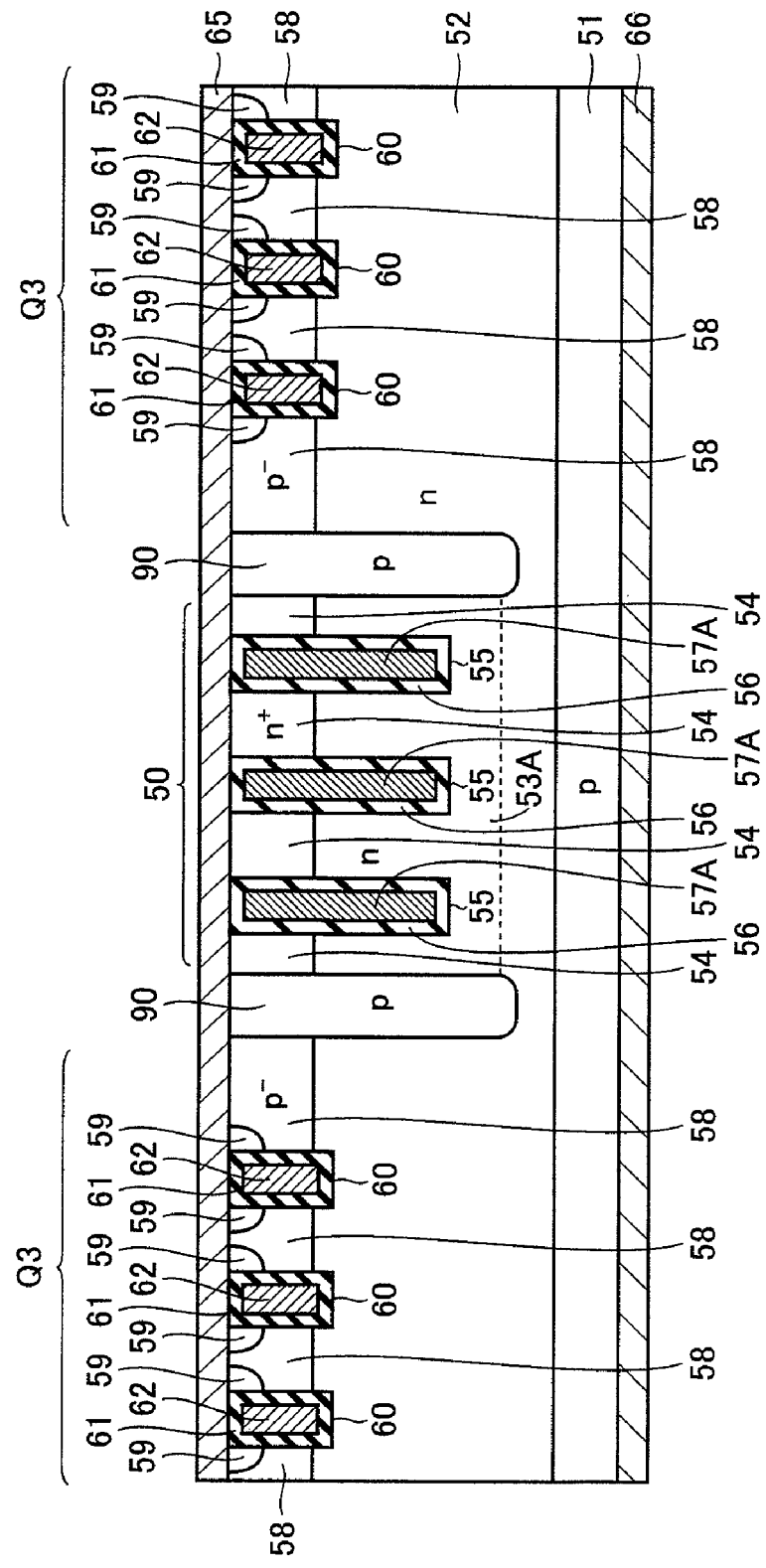
FIG. 30 is a cross-sectional view taken along line XXX-XXX in FIG. 29.

FIG. 30 is a cross-sectional view taken along line XXX-XXX in FIG. 29.

Referring to FIGS. 29 and 30, power semiconductor device 41B differs from power semiconductor device 41A in that a plurality of trenches 55 are formed within resistance region 50 and in that a p-type region 90 is formed to surround resistance region 50. P-type region 90 is the impurity diffusion region (isolation region) for isolating the IGBT element and the variable resistance.

Steps of manufacturing the power semiconductor device of the second embodiment will then be described with reference to FIGS. 31 to 40. Detailed description of the steps common to the steps of manufacturing the power semiconductor device of the first embodiment, however, will not be repeated hereinafter.

Figure 31:
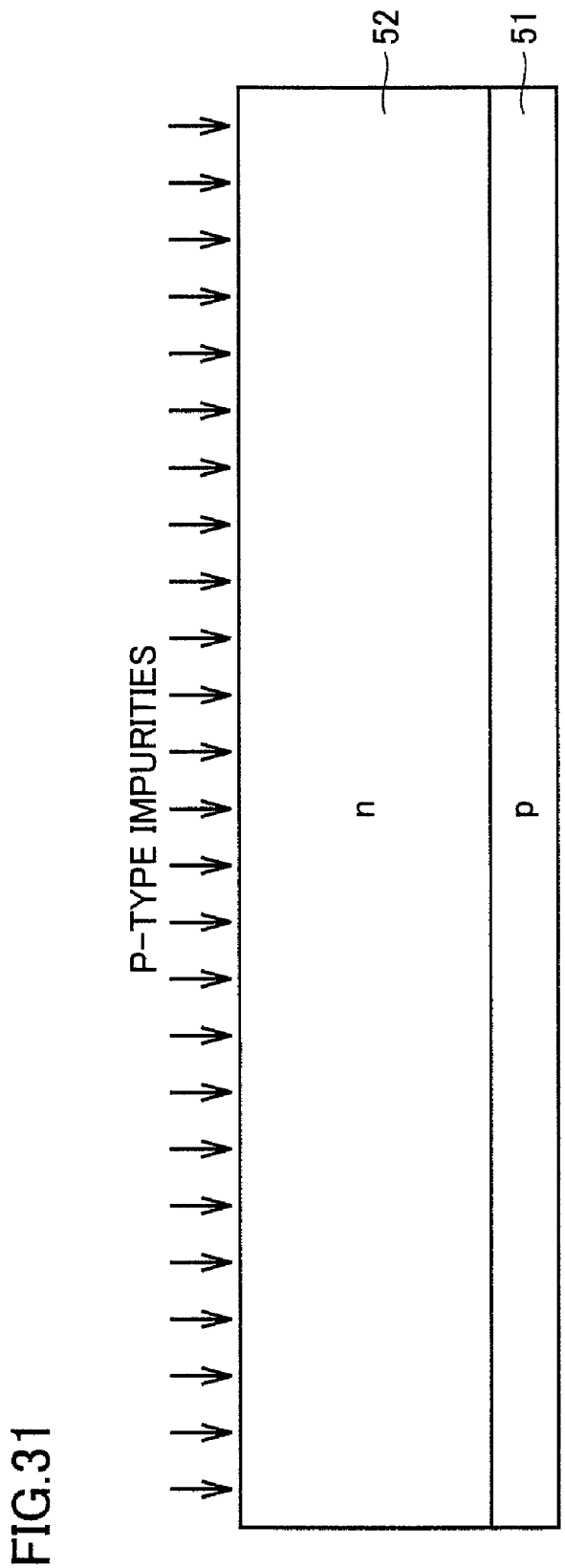
FIG. 31 is a schematic cross-sectional view showing a first step of a method for manufacturing a power semiconductor device 41B of the second embodiment.

FIG. 31 is a schematic cross-sectional view showing a first step of a method for manufacturing power semiconductor device 41B of the second embodiment. Referring to FIG. 31, p-type region 51 and n-type region 52 are formed on the semiconductor substrate similarly to the first embodiment. Next, the p-type impurity ions are implanted into the first main surface of the semiconductor substrate.

Figure 32:
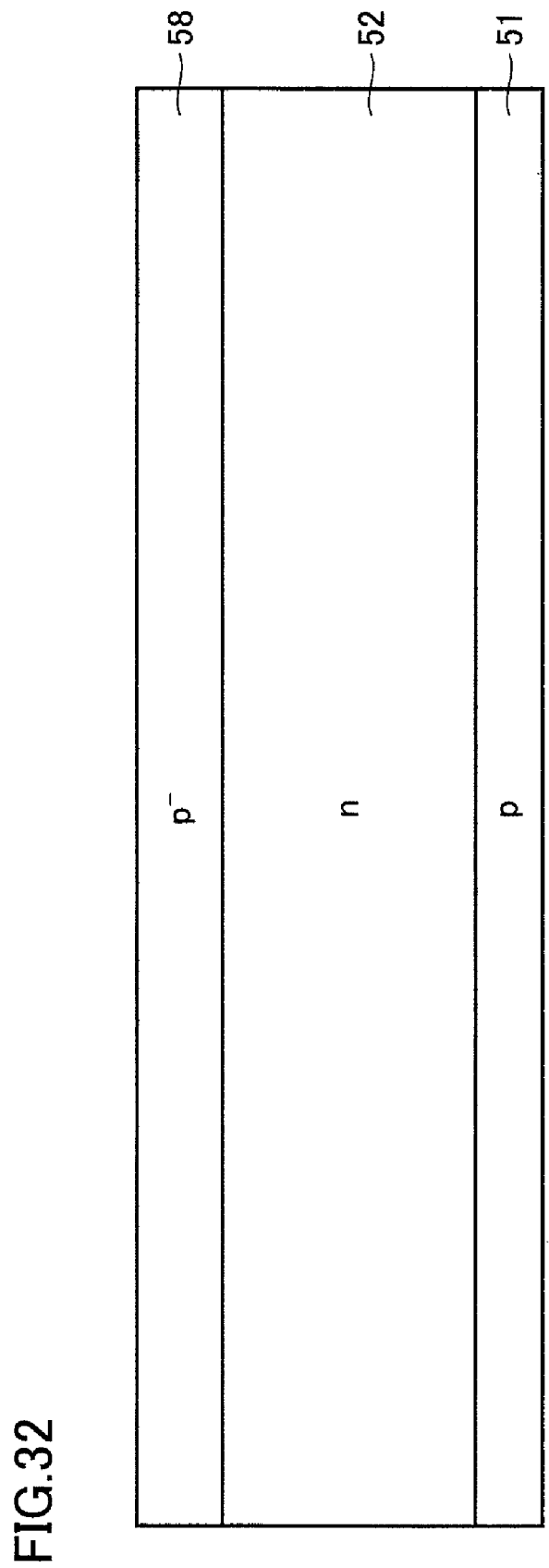
FIG. 32 is a schematic cross-sectional view showing a second step of the method for manufacturing power semiconductor device 41B of the second embodiment.

FIG. 32 is a schematic cross-sectional view showing a second step of the method for manufacturing power semiconductor device 41B of the second embodiment. Referring to FIG. 32, the heat treatment of the semiconductor substrate causes the p-type impurity ions implanted into the first main surface to diffuse. As a result, p$^-$-type region 58 is formed.

Figure 33:
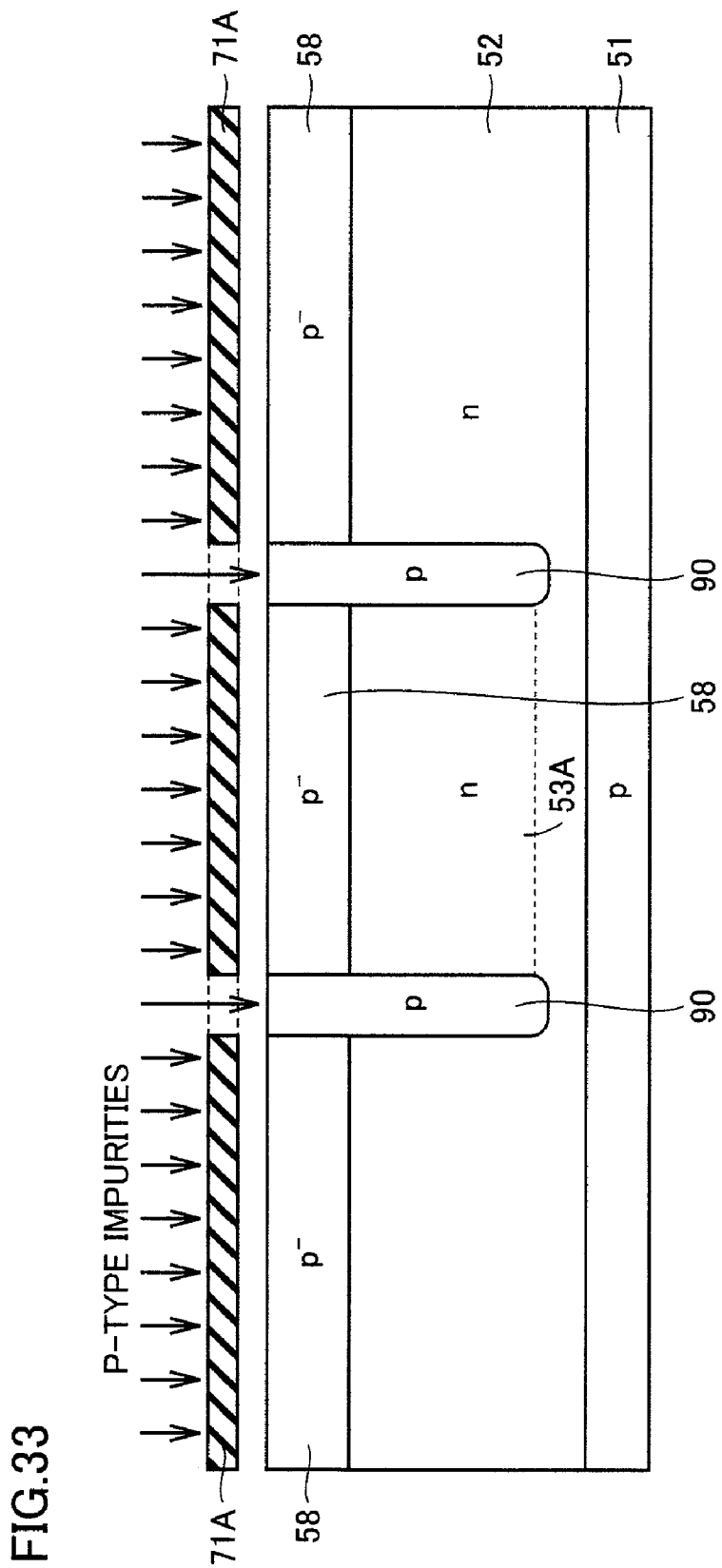
FIG. 33 is a schematic cross-sectional view showing a third step of the method for manufacturing power semiconductor device 41B of the second embodiment.

FIG. 33 is a schematic cross-sectional view showing a third step of the method for manufacturing power semiconductor device 41B of the second embodiment. Referring to FIG. 33, the p-type impurity ions are selectively implanted on the first main surface side of the semiconductor substrate by using a mask 71A (the photoresist may be used). By the subsequent heat treatment, p-type region 90 is formed to extend through p$^-$-type region 58. In addition, n-type region 53A is formed by p-type region 90.

Figure 34:
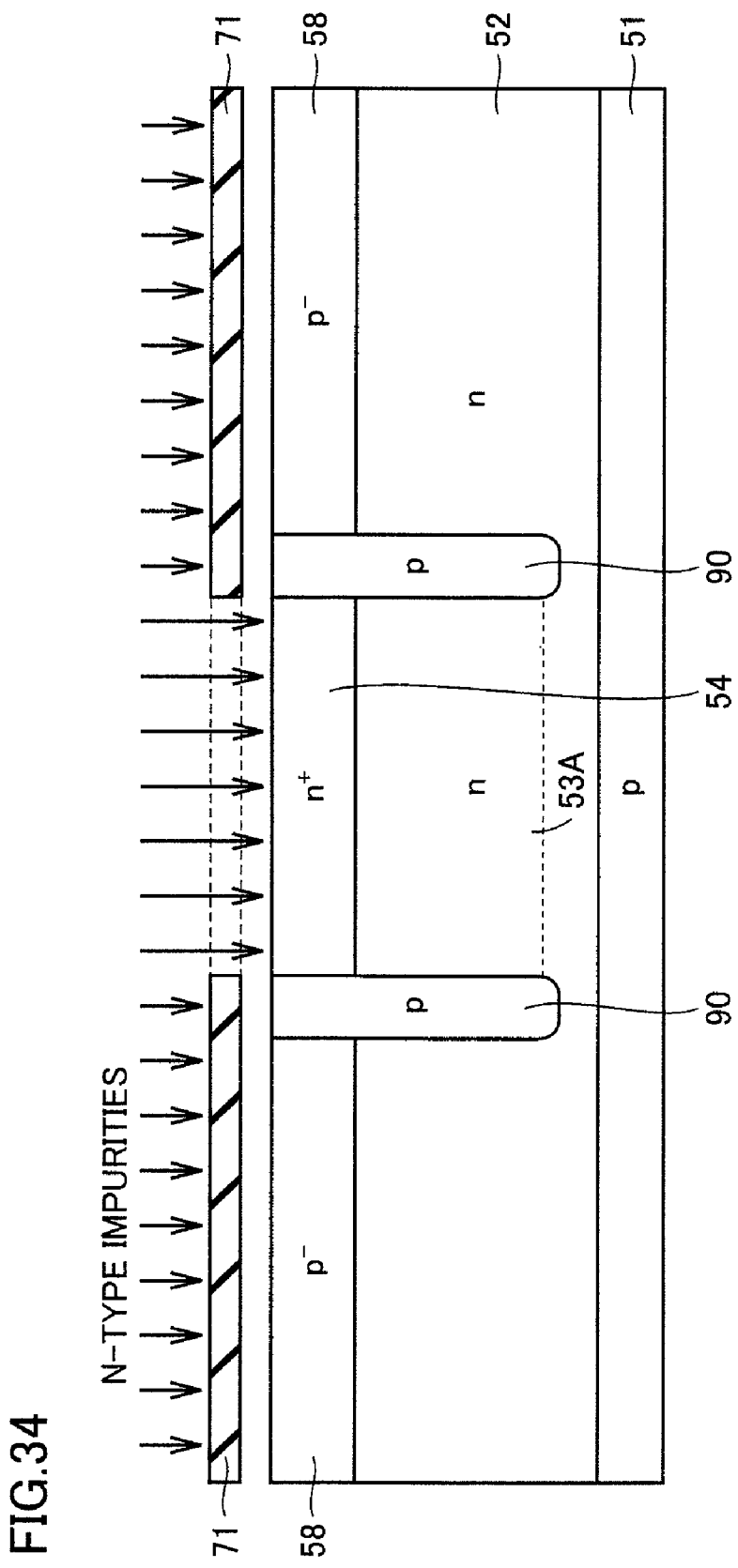
FIG. 34 is a schematic cross-sectional view showing a fourth step of the method for manufacturing power semiconductor device 41B of the second embodiment.

FIG. 34 is a schematic cross-sectional view showing a fourth step of the method for manufacturing power semiconductor device 41B of the second embodiment. Referring to FIG. 34, the n-type impurity ions are selectively implanted on the first main surface side of the semiconductor substrate by using mask 71 (the photoresist may be used). By the subsequent heat treatment, n$^+$-type contact region 54 is formed in a region surrounded by p-type region 90 in the first main surface of the semiconductor substrate.

Figure 35:
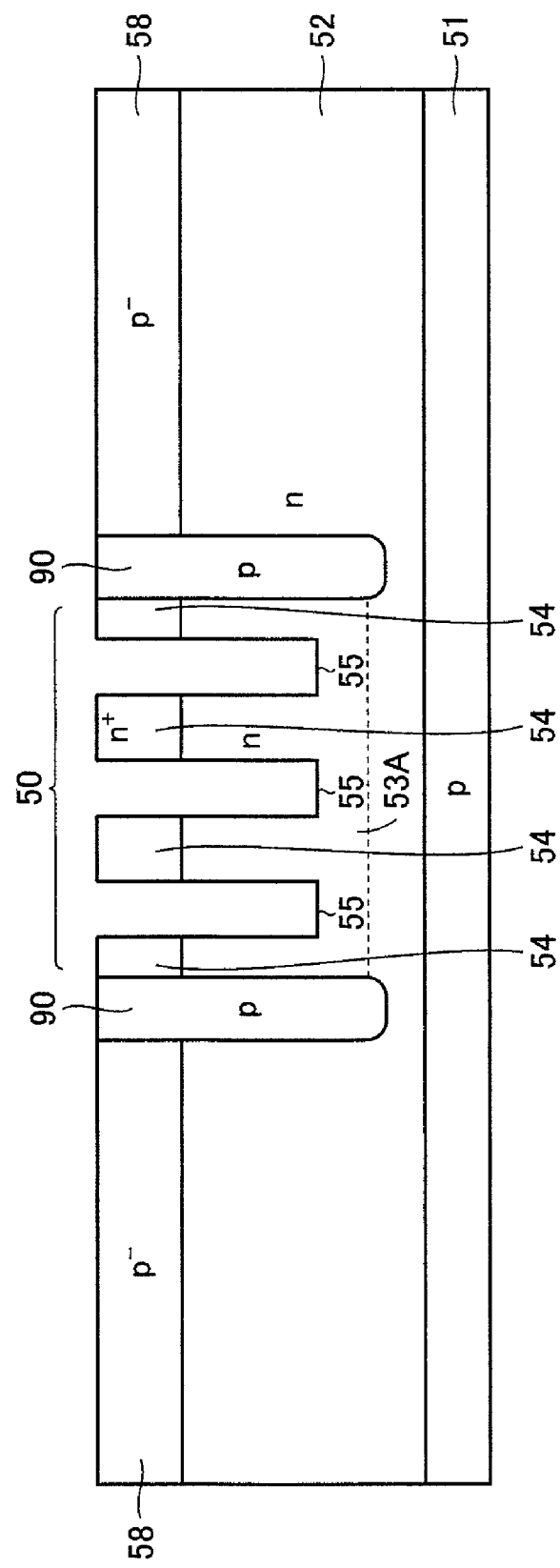
FIG. 35 is a schematic cross-sectional view showing a fifth step of the method for manufacturing power semiconductor device 41B of the second embodiment.

FIG. 35 is a schematic cross-sectional view showing a fifth step of the method for manufacturing power semiconductor device 41B of the second embodiment. Referring to FIG. 35, by selective anisotropic etching of a plurality of portions of n$^+$-type contact region 54 in the first main surface of the semiconductor substrate, trench 55 is formed to extend from the first main surface of the semiconductor substrate through n$^+$-type contact region 54 to n-type region 53A.

Figure 36:
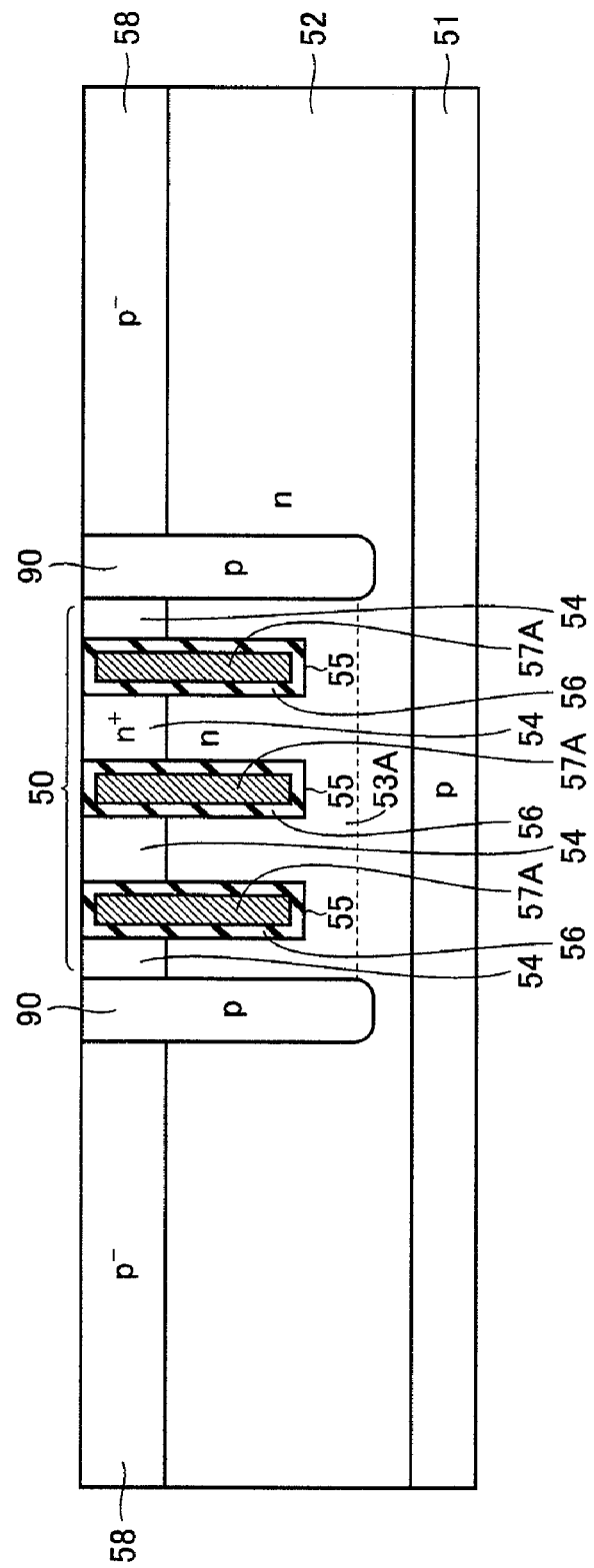
FIG. 36 is a schematic cross-sectional view showing a sixth step of the method for manufacturing power semiconductor device 41B of the second embodiment.

FIG. 36 is a schematic cross-sectional view showing a sixth step of the method for manufacturing power semiconductor device 41B of the second embodiment. Referring to FIG. 36, an inner surface of trench 55 is oxidized to form insulating film 56 (oxide film) inside trench 55. In addition, the polycrystalline silicon doped with the n-type impurities, for example, is deposited inside trench 55. Control electrode layer 57A is formed by this polycrystalline silicon.

Figure 37:
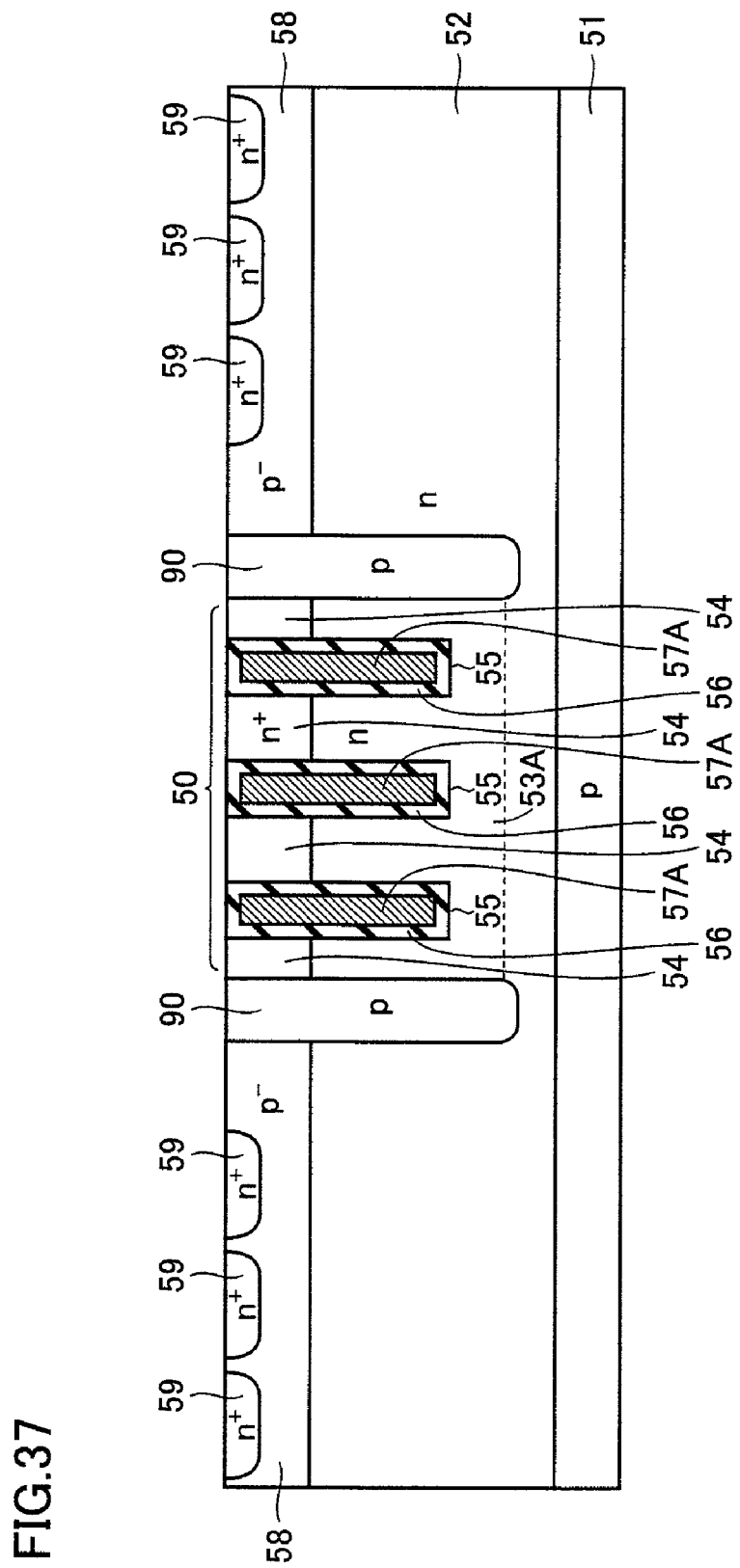
FIG. 37 is a schematic cross-sectional view showing a seventh step of the method for manufacturing power semiconductor device 41B of the second embodiment.

FIG. 37 is a schematic cross-sectional view showing a seventh step of the method for manufacturing power semiconductor device 41B of the second embodiment. Referring to FIG. 37, the n-type impurity ions are selectively implanted into p$^-$-type region 58. Next, the semiconductor substrate is subjected to heat treatment. As a result, n-type emitter region 59 is formed.

Figure 38:
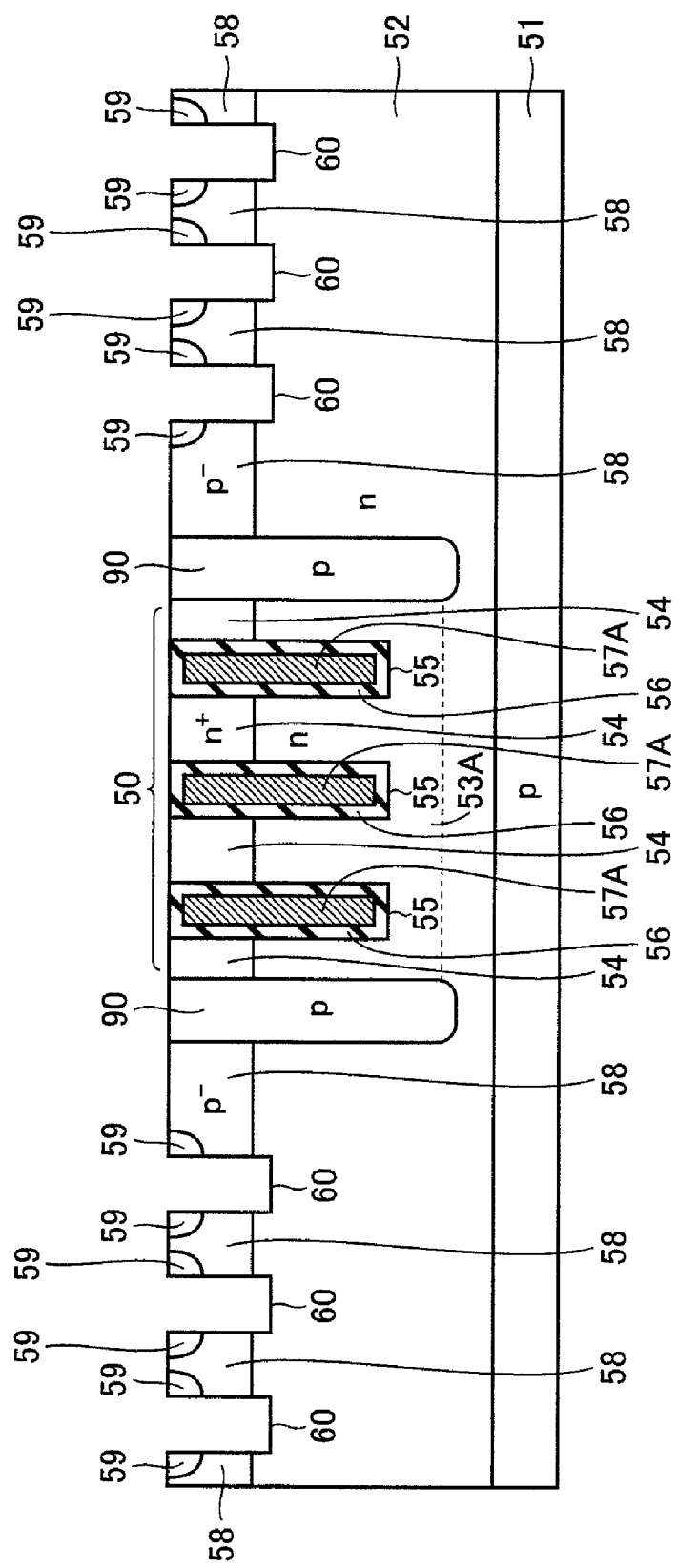
FIG. 38 is a schematic cross-sectional view showing an eighth step of the method for manufacturing power semiconductor device 41B of the second embodiment.

FIG. 38 is a schematic cross-sectional view showing an eighth step of the method for manufacturing power semiconductor device 41B of the second embodiment. Referring to FIG. 38, by anisotropic etching of a region where n-type emitter region 59 is formed in the first main surface of the semiconductor substrate, trench 60 is formed to extend from the first main surface of the semiconductor substrate through n-type emitter region 59 and p$^-$-type region 58 to n-type region 52.

Figure 39:
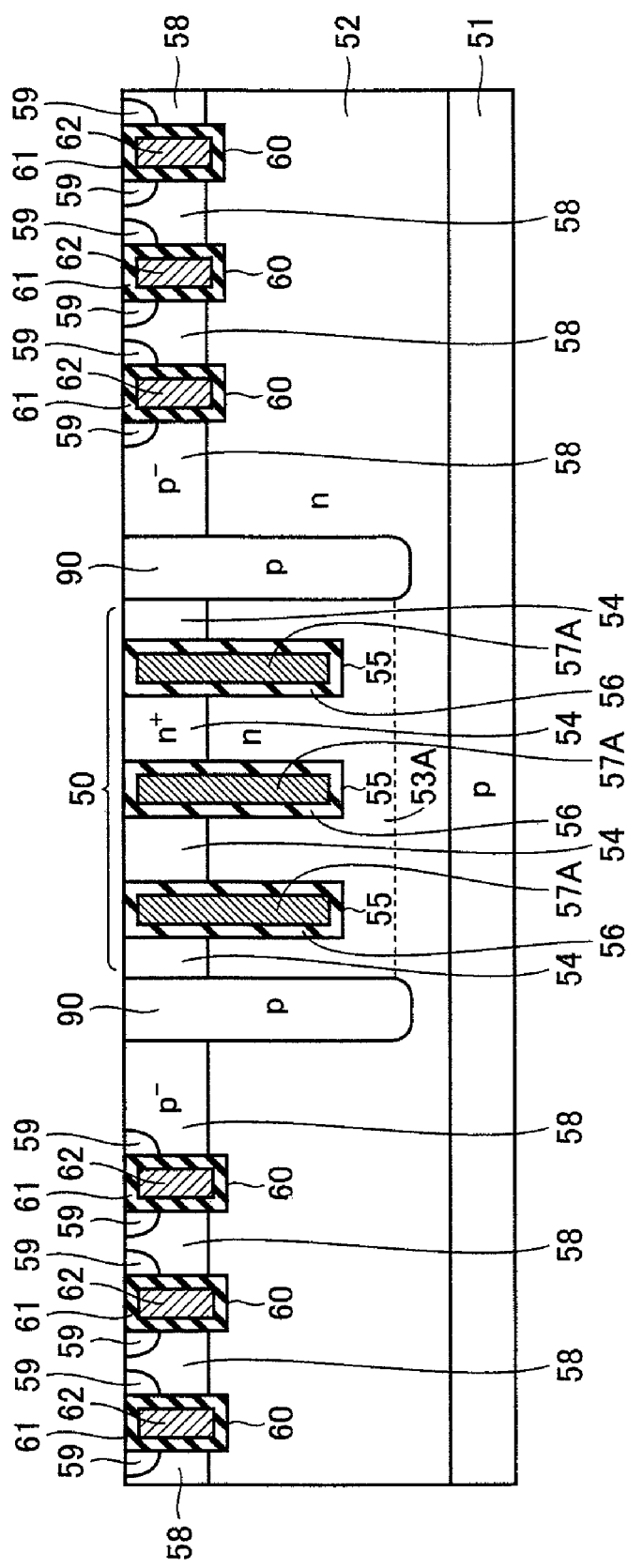
FIG. 39 is a schematic cross-sectional view showing a ninth step of the method for manufacturing power semiconductor device 41B of the second embodiment.

FIG. 39 is a schematic cross-sectional view showing a ninth step of the method for manufacturing power semiconductor device 41B of the second embodiment. Referring to FIG. 39, an inner surface of trench 60 is oxidized to form an oxide film (insulating film 61) inside trench 60. In addition, the polycrystalline silicon doped with the n-type impurities, for example, is deposited inside trench 60. Control electrode layer 62 is formed by this polycrystalline silicon.

Figure 40:
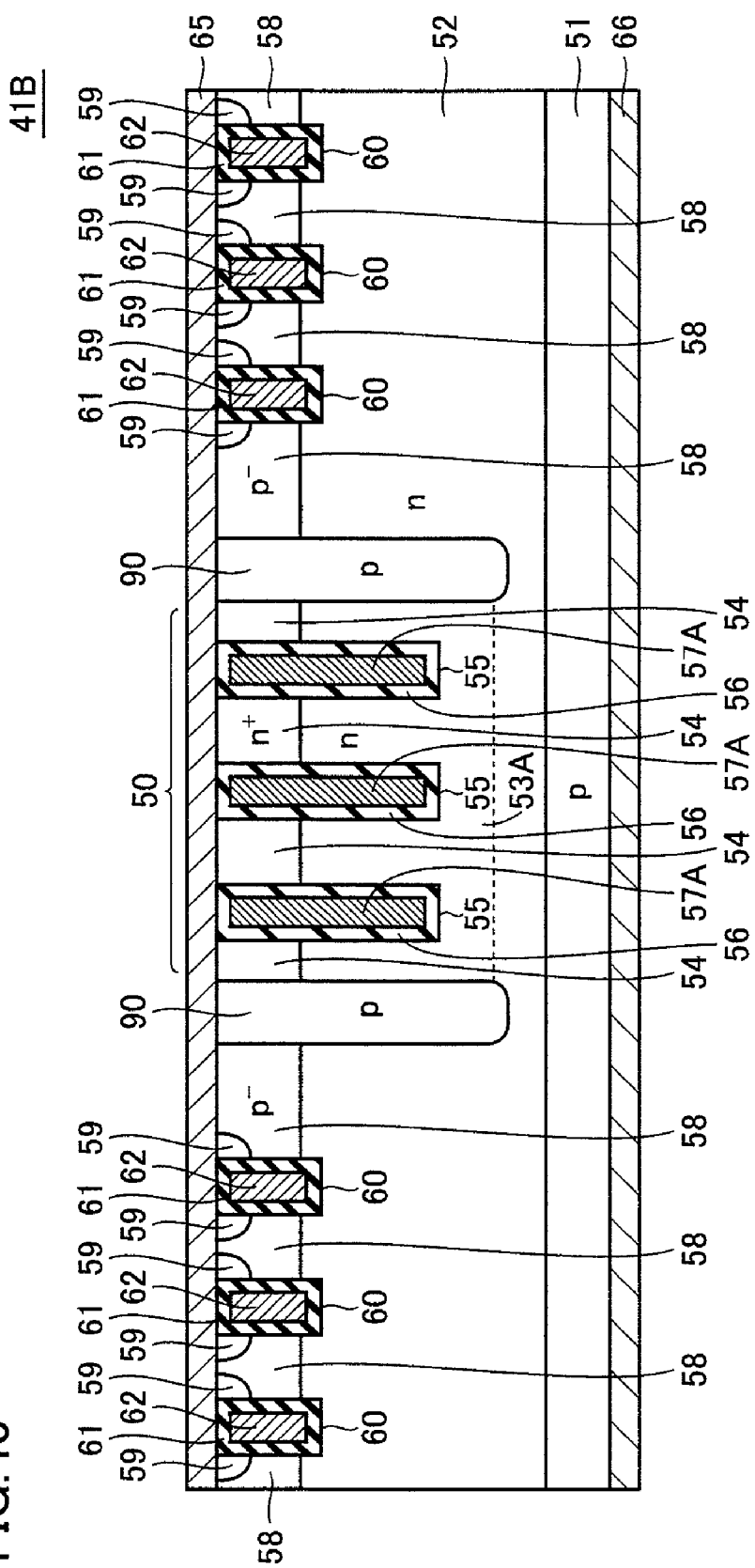
FIG. 40 is a schematic cross-sectional view showing a tenth step of the method for manufacturing power semiconductor device 41B of the second embodiment.

FIG. 40 is a schematic cross-sectional view showing a tenth step of the method for manufacturing power semiconductor device 41B of the second embodiment. Referring to FIG. 40, main electrode 65 is formed on the first main surface side of the semiconductor substrate to electrically connect $p^-$-type region 58, n-type emitter region 59, $n^+$-type contact region 54, and p-type region 90. On the other hand, main electrode 66 is formed on the second main surface side of the semiconductor substrate to electrically connect p-type region 51. As a result, power semiconductor device 41B is completed.

<Method for Controlling Depletion-Type MOSFET>

Figure 41:
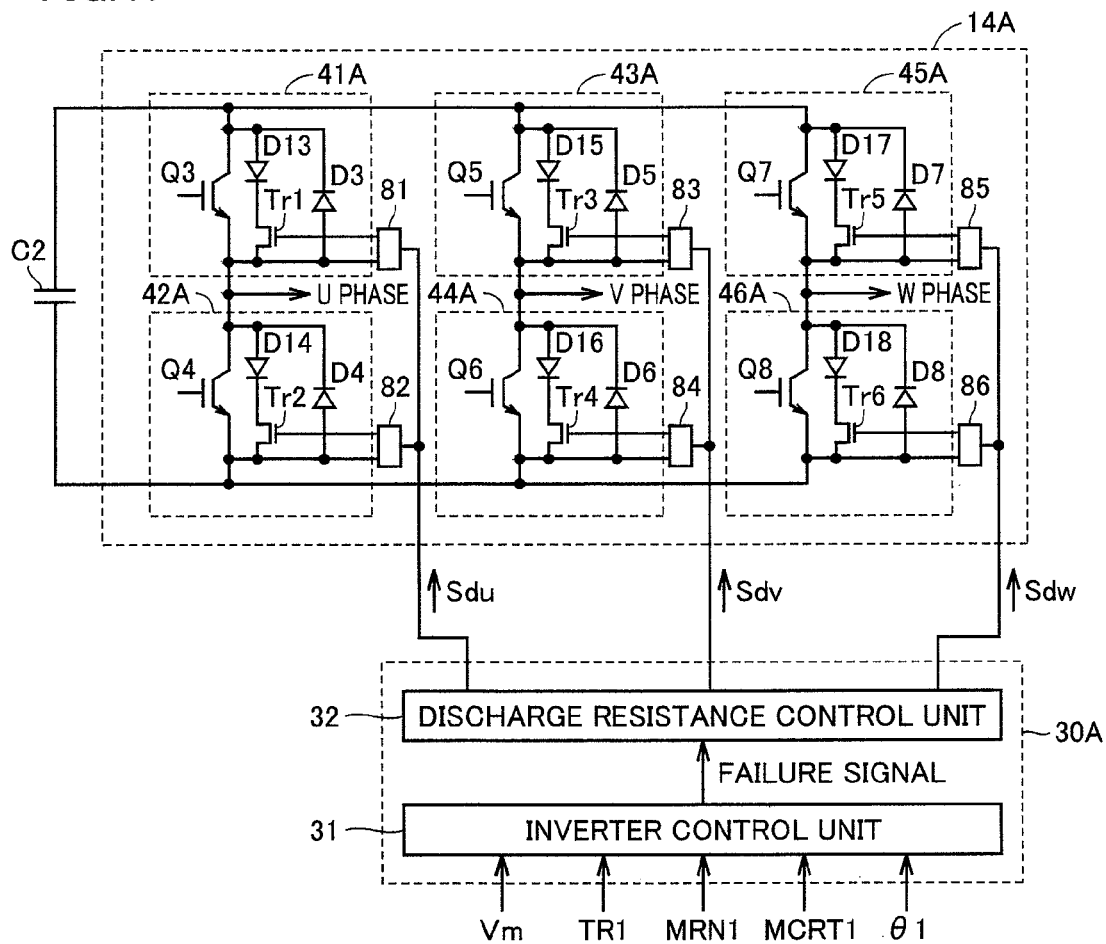
FIG. 41 illustrates control of transistors Tr1 to Tr6.

FIG. 41 illustrates control of transistors Tr1 to Tr6. Referring to FIG. 41, controller 30A includes an inverter control unit 31 and a discharge resistance control unit 32. Inverter control unit 31 receives output voltage Vm of boost converter 12 detected by voltage sensor 13 (see FIG. 16), torque command value TR1, motor rotation speed MRN1, motor current MCRT1, and rotation angle θ1, and controls IGBT elements Q3 to Q8. In addition, inverter control unit 31 detects a failure of inverter 14A based on voltage Vm, torque command value TR1, motor rotation speed MRN1, motor current MCRT1, and rotation angle θ1. Upon detection of a failure of inverter 14A, inverter control unit 31 outputs, to discharge resistance control unit 32, a failure signal indicating that the failure of inverter 14A occurs.

Upon reception of the failure signal, discharge resistance control unit 32 outputs a discharge signal Sdu to discharge resistance driving circuits 81 and 82, outputs a discharge signal Sdv to discharge resistance driving circuits 83 and 84, and outputs a discharge signal Sdw to discharge resistance driving circuits 85 and 86.

In response to discharge signal Sdu, discharge resistance driving circuits 81 and 82 turn on transistors Tr1 and Tr2 (bring transistors Tr1 and Tr2 into conduction), respectively. Specifically, discharge resistance driving circuit 81 (82) applies a control voltage for turning on transistor Tr1 (Tr2) to the gate of transistor Tr1 (Tr2), in response to discharge signal Sdu.

Similarly, in response to discharge signal Sdv, discharge resistance driving circuits 83 and 84 turn on transistors Tr3 and Tr4, respectively. In response to discharge signal Sdw, discharge resistance driving circuits 83 and 84 turn on transistors Tr5 and Tr6, respectively.

On the other hand, in a case where discharge resistance control unit 32 does not receive the failure signal, discharge resistance control unit 32 does not output discharge signals Sdu, Sdv and Sdw. In this case, discharge resistance driving circuits 81 to 86 apply a control voltage for turning off transistors Tr1 to Tr6 (bringing transistors Tr1 to Tr6 out of conduction), respectively, to the gate of the corresponding transistor. As a result, transistors Tr1 to Tr6 are turned off.

It is noted that inverter 14A is shown to include power semiconductor devices 41A to 46A in FIG. 41. Inverter 14A may be, however, configured to include power semiconductor devices 41B to 46B.

Figure 42:
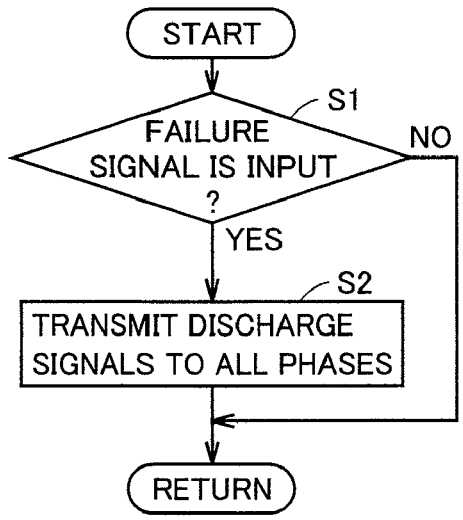
FIG. 42 is a flowchart illustrating a process by a discharge resistance control unit 32.

FIG. 42 is a flowchart illustrating a process by discharge resistance control unit 32. Referring to FIG. 42, discharge resistance control unit 32 determines whether or not the failure signal is input (whether or not the failure signal is received) (step S1). In a case where the failure signal is input (YES in step S1), discharge resistance control unit 32 transmits the discharge signals to the discharge resistance driving circuits (discharge resistance driving circuits 81 to 86) of all of the U-, V- and W-phases (step S2). In a case where the failure signal is not input (NO in step S1), or when the process in step S2 ends, the overall process is returned to step S1.

Figure 43:
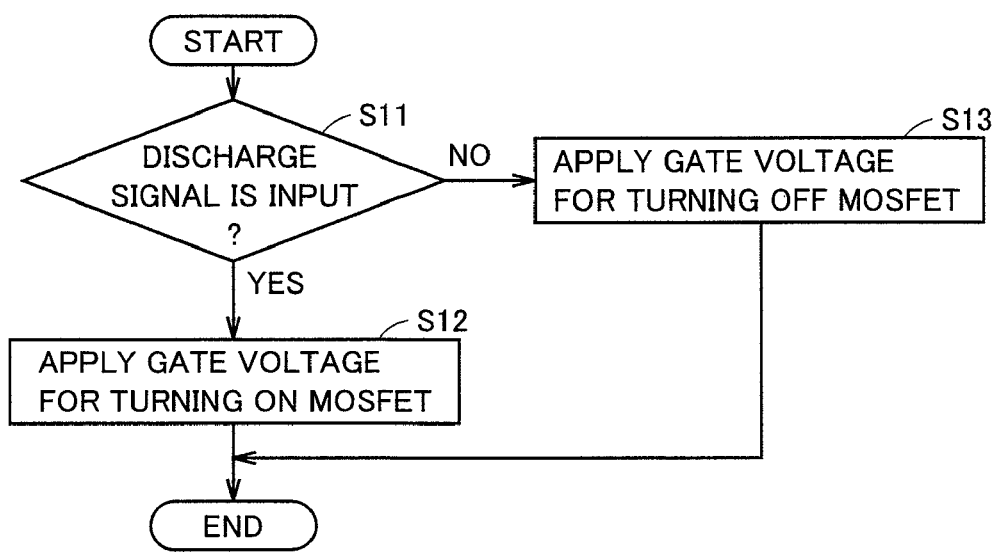
FIG. 43 is a flowchart illustrating a process by each of discharge resistance driving circuits 81 to 86.

FIG. 43 is a flowchart illustrating a process by each of discharge resistance driving circuits 81 to 86. Each of discharge resistance driving circuits 81 to 86 performs the process in accordance with the flowchart in FIG. 43. In the following, however, FIG. 43 is assumed to be the flowchart illustrating the process by discharge resistance driving circuit 81 for convenience in description. Referring to FIG. 43, discharge resistance driving circuit 81 determines whether or not discharge signal Sdu is input (whether or not discharge signal Sdu is received) (step S11). In a case where discharge signal Sdu is input (YES in step S11), discharge resistance driving circuit 81 applies a gate voltage for turning on transistor Tr1 (shown as "MOSFET" in FIG. 43) to the gate of transistor Tr1 (step S12). On the other hand, in a case where discharge signal Sdu is not input (NO in step S11), discharge resistance driving circuit 81 applies a gate voltage for turning off transistor Tr1 to the gate of transistor Tr1 (step S13). When the process in step S12 or step S13 ends, the overall process ends.

According to the second embodiment, the effect similar to that of the first embodiment can be obtained. In addition, according to the second embodiment, the following effects can be obtained.

First, the energy loss due to the discharge resistance can be lessened as compared with that of the first embodiment. The discharge resistance of the first embodiment is a fixed resistance. Therefore, energy is constantly consumed at the discharge resistance during operation of the inverter. In the second embodiment, however, when the inverter is operated normally, all of transistors Tr1 to Tr6 can be turned off by discharge resistance control unit 32 and discharge resistance driving circuits 81 to 86. As a result, the energy loss of the discharge resistance can be lessened during operation of the inverter.

In addition, according to the second embodiment, capacitor C2 can be discharged rapidly, and therefore, safety can be improved during replacement of the inverter. Generally, in order to minimize the energy loss in the discharge resistance, a resistance value of the discharge resistance is set to be relatively high (for example, the resistance value is set to be a level of several tens of kΩ). The higher the resistance value of the discharge resistance is set, however, the longer the discharge time of capacitor C2 becomes. Therefore, in a case where the resistance value of the discharge resistance is high, it is difficult to reduce the voltage of capacitor C2 in a short time. According to the second embodiment, since transistors Tr1 to Tr6 are turned on at the time of a failure of the inverter, the resistance value of the discharge resistance is reduced. As a result, capacitor C2 can be discharged rapidly. Therefore, safety can be improved during replacement of the inverter.

Moreover, in the second embodiment, the depletion-type MOSFET is used as the discharge resistance. The depletion-type MOSFET is brought into conduction even if a voltage is not applied to the gate electrode. Therefore, transistors Tr1 to Tr6 can form the discharge resistance even if discharge resistance control unit 32 and discharge resistance driving circuits 81 to 86 are not operated. Therefore, even if some abnormality occurs in discharge resistance control unit 32 or discharge resistance driving circuits 81 to 86, capacitor C2 can be surely discharged.

Third Embodiment

A schematic block diagram of a motor drive apparatus of a third embodiment is similar to that in FIG. 16. Furthermore, a structure of a power semiconductor device according to the third embodiment is similar to that of power semiconductor device 41A or 41B of the second embodiment. It is noted that power semiconductor devices 41A to 46A are included in inverter 14A hereinafter.

In the third embodiment, the discharge resistance (depletion-type MOSFET) is controlled based on the temperature of the arm of each phase of the inverter.

Figure 44:
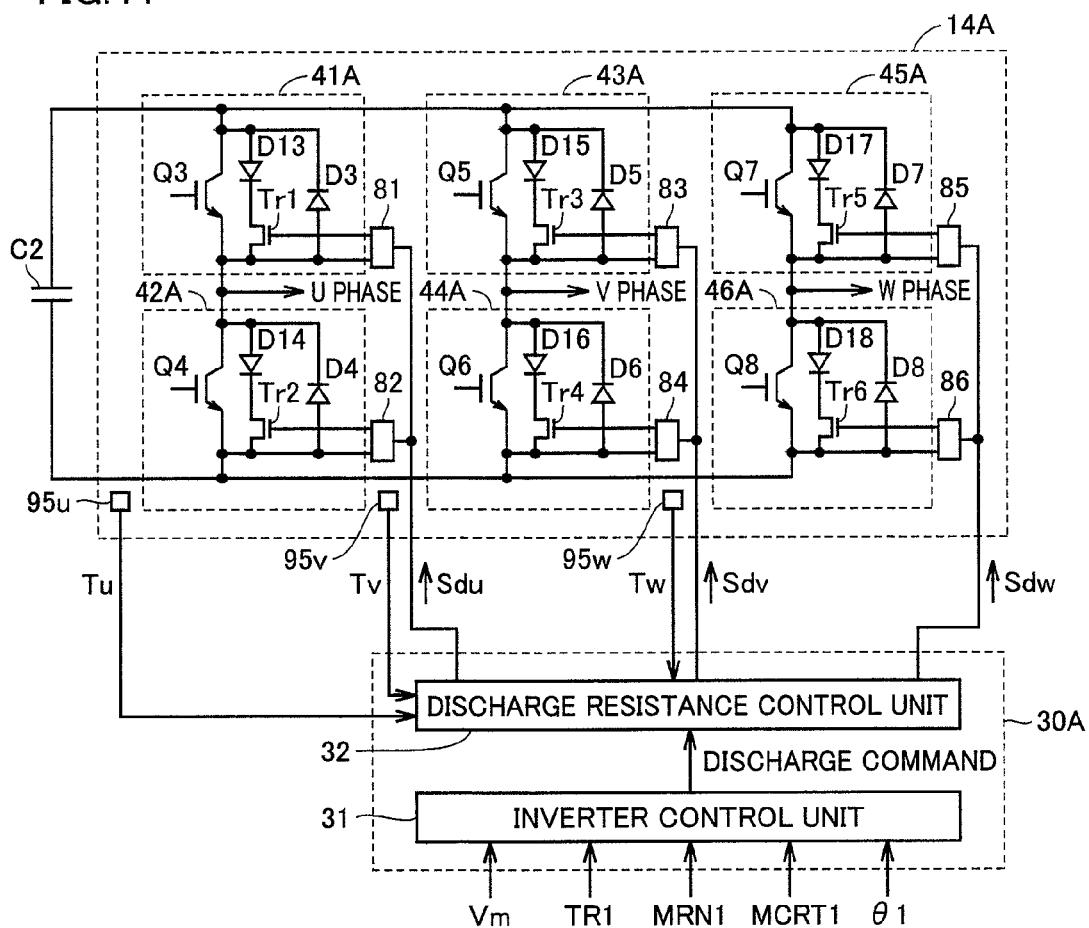
FIG. 44 illustrates control of transistors Tr1 to Tr6 in a third embodiment.

FIG. 44 illustrates control of transistors Tr1 to Tr6 in the third embodiment. Referring to FIGS. 44 and 41, inverter 14A according to the third embodiment differs from inverter 14A according to the second embodiment in that inverter 14A according to the third embodiment further includes a temperature sensor 95u for detecting the temperature of the U-phase arm, a temperature sensor 95v for detecting the temperature of the V-phase arm, and a temperature sensor 95w for detecting the temperature of the W-phase arm. Temperature sensor 95u sends, to discharge resistance control unit 32, a temperature value Tu that is a result of the detection by temperature sensor 95u. Temperature sensor 95v sends, to discharge resistance control unit 32, a temperature value Tv that is a result of the detection by temperature sensor 95v. Temperature sensor 95w sends, to discharge resistance control unit 32, a temperature value Tw that is a result of the detection by temperature sensor 95w.

It is noted that, in the third embodiment, each of power semiconductor devices 41A to 46A may have a temperature sensor built in. In a case where the power semiconductor device is configured in such a manner, discharge resistance control unit 32, for example, determines the lower one of a value detected by a temperature sensor of power semiconductor device 41A and a value detected by a temperature sensor of power semiconductor device 42A, as the temperature of the U-phase arm. Furthermore, methods for determining the temperature of the V-phase arm and the temperature of the W-phase arm are also similar to the method for determining the temperature of the U-phase arm.

Discharge resistance control unit 32 compares temperature values Tu, Tv and Tw in accordance with a discharge command from inverter control unit 31. Discharge resistance control unit 32 specifies one arm corresponding to the lowest value among temperature values Tu, Tv and Tw. Then, discharge resistance control unit 32 causes discharge of capacitor C2 by using the discharge resistance corresponding to the specified arm.

Figure 45:
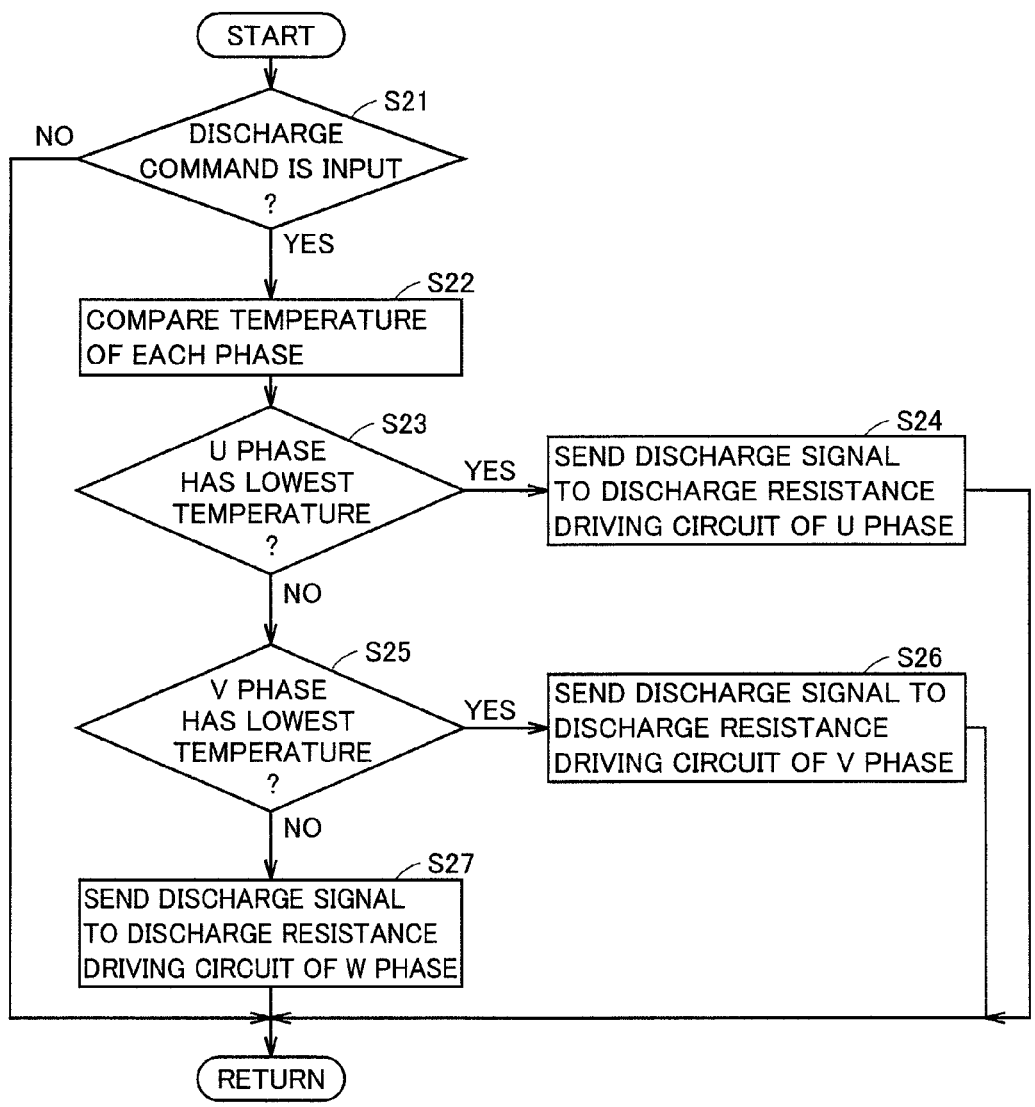
FIG. 45 is a flowchart illustrating a process performed by discharge resistance control unit 32 in FIG. 44.

FIG. 45 is a flowchart illustrating a process performed by discharge resistance control unit 32 in FIG. 44. Referring to FIGS. 45 and 44, in step S21, discharge resistance control unit 32 determines whether or not a discharge command is input (whether or not a discharge command is received) (step S21). In a case where the discharge command is not input (NO in step S21), the overall process is returned to step S21. In a case where the discharge command is input (YES in step S21), discharge resistance control unit 32 receives temperature values Tu, Tv and Tw that are the temperature values of the respective U-, V- and W-phase arms. Then, discharge resistance control unit 32 compares temperature values Tu, Tv and Tw (step S22).

Discharge resistance control unit 32 determines whether or not the temperature of the U-phase arm is the lowest temperature, based on temperature values Tu, Tv and Tw (step S23). In a case where the temperature of the U-phase arm is lowest (YES in step S23), discharge resistance control unit 32 sends discharge signal Sdu to discharge resistance driving circuits 81 and 82 of the U-phase arm (step S24). In response to discharge signal Sdu, discharge resistance driving circuits 81 and 82 turn on transistors Tr1 and Tr2, respectively. In this case, transistors Tr1 and Tr2 form the discharge resistance.

In a case where the temperature of the U-phase arm is not the lowest temperature (NO in step S23), discharge resistance control unit 32 determines whether or not the temperature of the V-phase arm is the lowest temperature (step S25). In a case where the temperature of the V-phase arm is lowest (YES in step S25), discharge resistance control unit 32 sends discharge signal Sdv to discharge resistance driving circuits 83 and 84 of the V-phase arm (step S26). In response to discharge signal Sdv, discharge resistance driving circuits 83 and 84 turn on transistors Tr3 and Tr4, respectively. In this case, transistors Tr3 and Tr4 form the discharge resistance of capacitor C2.

In a case where the temperature of the V-phase arm is not the lowest temperature (NO in step S25), discharge resistance control unit 32 determines that the temperature of the W-phase arm is the lowest temperature (step S27). In step S27, discharge resistance control unit 32 further sends discharge signal Sdw to discharge resistance driving circuits 85 and 86 of the W-phase (step S27). In response to discharge signal Sdw, discharge resistance driving circuits 85 and 86 turn on transistors Tr5 and Tr6, respectively. As a result, transistors Tr5 and Tr6 form the discharge resistance of capacitor C2.

In each of steps S24, S26 and S27, the discharge resistance is used to discharge capacitor C2. It is noted that, when the process in any one of steps S24, S26 and S27 ends, the overall process is returned to step S21.

As described above, in the third embodiment, the discharge resistance corresponding to the arm having the lowest temperature among the plurality of arms is used to discharge the capacitor. If the temperature of the IGBT element or the temperature of the discharge resistance is excessively raised, the IGBT element or the discharge resistance may be damaged. In the third embodiment, however, the discharge resistance corresponding to the arm having the lowest temperature is used to discharge the capacitor, and therefore, the occurrence of such a problem can be prevented.

Although the IGBT is illustrated as an example of the power semiconductor element in the present embodiments, the present invention can also be used suitably for a power semiconductor element other than the IGBT (for example, an MOSFET, a bipolar transistor and the like).

It should be understood that the embodiments disclosed herein are illustrative and not limitative in any respect. The scope of the present invention is defined by the terms of the claims, rather than the description above, and is intended to include any modifications within the scope and meaning equivalent to the terms of the claims.

The invention claimed is:

1. A power semiconductor device comprising:
first and second main electrodes formed on first and second main surfaces of a semiconductor substrate, respectively;
a power semiconductor element formed in said semiconductor substrate and electrically connected to said first and second main electrodes; and
a resistance element formed in said semiconductor substrate and electrically connected to said first and second main electrodes in parallel with said power semiconductor element, wherein
said power semiconductor element includes a first control electrode configured to control a current flowing between said first and second main electrodes, in accordance with a first control voltage,
said semiconductor substrate has a first conductivity type,
said power semiconductor element further includes
a first region of a second conductivity type formed on said first main surface of said semiconductor substrate,
a second region of said second conductivity type formed on said second main surface of said semiconductor substrate and sandwiching a low concentration region that is a region of said first conductivity type in said semiconductor substrate, between said second region and said first region, and
a third region of said first conductivity type formed to overlap said first region in said first main surface,
a first trench extending from said first main surface through said third and first regions to said low concentration region as well as a second trench surrounding a predetermined region in said first main surface and formed more deeply than said first trench are formed in said semiconductor substrate,
said first control electrode is formed inside said first trench to face said first region, said third region and said low concentration region with an insulating film interposed,
said resistance element includes
a fourth region of said first conductivity type formed in said predetermined region, and
a fifth region of said first conductivity type buried under said fourth region and formed such that a resistance value per unit volume is higher than that of said low concentration region,
said first main electrode is electrically connected to said first, third and fourth regions, and
said second main electrode is electrically connected to said second region.

2. The power semiconductor device according to claim 1, further comprising
an insulating layer formed to fill said second trench.

3. A power semiconductor device comprising:
first and second main electrodes formed on first and second main surfaces of a semiconductor substrate, respectively;
a power semiconductor element formed in said semiconductor substrate and electrically connected to said first and second main electrodes; and
a resistance element formed in said semiconductor substrate and electrically connected to said first and second main electrodes in parallel with said power semiconductor element, wherein
said power semiconductor element includes a first control electrode configured to control a current flowing between said first and second main electrodes, in accordance with a first control voltage,
said semiconductor substrate has a first conductivity type,
said power semiconductor element further includes
a first region of a second conductivity type formed on said first main surface of said semiconductor substrate,
a second region of said second conductivity type formed on said second main surface of said semiconductor substrate and sandwiching a low concentration region that is a region of said first conductivity type in said semiconductor substrate, between said second region and said first region, and
a third region of said first conductivity type formed to overlap said first region in said first main surface,
a first trench extending from said first main surface through said third and first regions to said low concentration region as well as a second trench surrounding a predetermined region in said first main surface and formed more deeply than said first trench are formed in said semiconductor substrate,
said first control electrode is formed inside said first trench to face said first region, said third region and said low concentration region with a first insulating film interposed,
said resistance element is a depletion-type MOSFET and includes
a fourth region of said first conductivity type formed in said predetermined region,
a fifth region of said first conductivity type that is a portion surrounded by said second trench in said low concentration region,
a second insulating film formed to cover at least a sidewall of said second trench, and
a second control electrode formed to face said fourth and fifth regions with said second insulating film interposed,
said first main electrode is electrically connected to said first, third and fourth regions, and
said second main electrode is electrically connected to said second region.

4. A power semiconductor device comprising:
first and second main electrodes formed on first and second main surfaces of a semiconductor substrate, respectively;
a power semiconductor element formed in said semiconductor substrate and electrically connected to said first and second main electrodes; and
a resistance element formed in said semiconductor substrate and electrically connected to said first and second main electrodes in parallel with said power semiconductor element, wherein
said power semiconductor element includes a first control electrode configured to control a current flowing between said first and second main electrodes, in accordance with a first control voltage,
said semiconductor substrate has a first conductivity type,
said power semiconductor element further includes
a first region of a second conductivity type formed on said first main surface of said semiconductor substrate,
a second region of said second conductivity type formed on said second main surface of said semiconductor substrate and sandwiching a low concentration region that is a region of said first conductivity type in said semiconductor substrate, between said second region and said first region, and
a third region of said first conductivity type formed to overlap said first region in said first main surface,
a first trench extending from said first main surface through said third and first regions to said low concentration region, an isolation region of said second conductivity type surrounding a predetermined region in said first main surface and extending from said first main surface through said first region to said low concentration region, and a second trench extending from said first main surface through said first region to said low concentration region within said predetermined region are formed in said semiconductor substrate,
said first control electrode is formed inside said first trench to face said first region, said third region and said low concentration region with a first insulating film interposed,
said resistance element is a depletion-type MOSFET and includes
a fourth region of said first conductivity type formed in said predetermined region, a fifth region of said first conductivity type that is a portion surrounded by said isolation region in said low concentration region,
a second insulating film formed to cover at least a sidewall of said second trench, and
a second control electrode formed to face said fourth and fifth regions with said second insulating film interposed, said first main electrode is electrically connected to said first, third and fourth regions, and
said second main electrode is electrically connected to said second region.

* * * * *